(12) United States Patent
Ishibashi et al.

(10) Patent No.: US 9,136,337 B2
(45) Date of Patent: Sep. 15, 2015

(54) GROUP III NITRIDE COMPOSITE SUBSTRATE AND METHOD FOR MANUFACTURING THE SAME, LAMINATED GROUP III NITRIDE COMPOSITE SUBSTRATE, AND GROUP III NITRIDE SEMICONDUCTOR DEVICE AND METHOD FOR MANUFACTURING THE SAME

(71) Applicant: SUMITOMO ELECTRIC INDUSTRIES, LTD., Osaka-shi, Osaka (JP)

(72) Inventors: Keiji Ishibashi, Itami (JP); Akihiro Hachigo, Itami (JP); Yuki Hiromura, Itami (JP); Naoki Matsumoto, Itami (JP); Seiji Nakahata, Itami (JP); Fumitake Nakanishi, Itami (JP); Yusuke Yoshizumi, Itami (JP); Hidenori Mikami, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 28 days.

(21) Appl. No.: 14/030,009

(22) Filed: Sep. 18, 2013

(65) Prior Publication Data
US 2014/0103353 A1 Apr. 17, 2014

Related U.S. Application Data

(60) Provisional application No. 61/712,967, filed on Oct. 12, 2012.

(30) Foreign Application Priority Data

Oct. 12, 2012 (JP) .................. 2012-226777
Nov. 30, 2012 (JP) .................. 2012-263090
Aug. 30, 2013 (JP) .................. 2013-179839

(51) Int. Cl.
*H01L 29/20* (2006.01)
*H01L 21/76* (2006.01)
(Continued)

(52) U.S. Cl.
CPC ........ *H01L 29/2003* (2013.01); *H01L 21/2007* (2013.01); *H01L 21/76254* (2013.01); *H01L 29/7786* (2013.01); *H01L 33/0079* (2013.01); *H01L 2924/0002* (2013.01)

(58) Field of Classification Search
CPC ................. H01L 29/2003; H01L 21/76254; H01L 21/2007; H01L 2924/0002; H01L 33/0079; H01L 29/7786; H01L 2924/00
USPC .............................. 257/76; 438/478
See application file for complete search history.

(56) References Cited

U.S. PATENT DOCUMENTS

2008/0169483 A1* 7/2008 Kasai et al. ............... 257/183
2009/0127662 A1 5/2009 Okahisa et al.
(Continued)

FOREIGN PATENT DOCUMENTS

JP 2002-319545 A 10/2002
JP 2006-210660 A 8/2006
(Continued)

OTHER PUBLICATIONS

International Search Report and Written Opinion issued Dec. 22, 2014 in PCT Application No. PCT/JP2014/075991 (8 pages) and English Translation (8 pages).
(Continued)

*Primary Examiner* — Steven Loke
*Assistant Examiner* — Didarul Mazumder
(74) *Attorney, Agent, or Firm* — Drinker Biddle & Reath LLP

(57) ABSTRACT

A group III nitride composite substrate includes a support substrate and a group III nitride film. A ratio $s_t/m_t$ of a standard deviation $s_t$ of the thickness of the group III nitride film, to a mean value $m_t$ of the thickness thereof is 0.001 or more and 0.2 or less, and a ratio $s_o/m_o$ of a standard deviation $s_o$ of an absolute value of an off angle between a main surface of the group III nitride film and a plane of a predetermined plane orientation, to a mean value $m_o$ of the absolute value of the off angle thereof is 0.005 or more and 0.6 or less. Accordingly, there is provided a low-cost and large-diameter group III nitride composite substrate including a group III nitride film having a large thickness, a small thickness variation, and a high crystal quality.

10 Claims, 6 Drawing Sheets

(51) Int. Cl.
*H01L 21/20* (2006.01)
*H01L 21/762* (2006.01)
*H01L 29/778* (2006.01)
*H01L 33/00* (2010.01)

(56) References Cited

U.S. PATENT DOCUMENTS

| | | |
|---|---|---|
| 2010/0025228 A1 | 2/2010 | Tauzin et al. |
| 2010/0164070 A1 | 7/2010 | Okahisa et al. |
| 2010/0210089 A1 | 8/2010 | Kasai et al. |
| 2010/0244196 A1* | 9/2010 | Yoshida .................. 257/615 |
| 2010/0295055 A1 | 11/2010 | Yamamoto |
| 2012/0256297 A1 | 10/2012 | Morioka et al. |
| 2012/0305066 A1 | 12/2012 | Fisher et al. |
| 2013/0020580 A1 | 1/2013 | Evans et al. |
| 2013/0137220 A1 | 5/2013 | Matsubara et al. |
| 2013/0161636 A1* | 6/2013 | Werkhoven et al. ............ 257/76 |

FOREIGN PATENT DOCUMENTS

| | | |
|---|---|---|
| JP | 2008-010766 A | 1/2008 |
| JP | 2008-166646 A | 7/2008 |
| JP | 2008-303138 A | 12/2008 |
| JP | 2009-126722 A | 6/2009 |
| JP | 2009-182341 A | 8/2009 |
| JP | 2010-182936 A | 8/2010 |
| JP | 2010-269970 A | 12/2010 |
| JP | 2012-230969 A | 11/2012 |
| WO | WO 2011/093481 | 8/2011 |

OTHER PUBLICATIONS

U.S. Appl. No. 14/097,460, Sumitomo Electric Industries, Ltd.

Office Action issued Apr. 6, 2015 in related U.S. Appl. No. 14/097,460.

* cited by examiner

GROUP III NITRIDE COMPOSITE SUBSTRATE AND METHOD FOR MANUFACTURING THE SAME, LAMINATED GROUP III NITRIDE COMPOSITE SUBSTRATE, AND GROUP III NITRIDE SEMICONDUCTOR DEVICE AND METHOD FOR MANUFACTURING THE SAME

This application claims the benefit of U.S. Provisional Application No. 61/712,967 filed Oct. 12, 2012, which is incorporated by reference herein in the entirety.

BACKGROUND OF THE INVENTION

1. Field of the Invention

The present invention relates to a group III nitride composite substrate and a method for manufacturing the same, a laminated group III nitride composite substrate, and a group III nitride semiconductor device and a method for manufacturing the same.

2. Description of the Background Art

Group III nitrides such as GaN have superior semiconductor properties and are therefore used as materials suitable for semiconductor devices.

For example, Japanese Patent Laying-Open No. 2009-126722 discloses a free-standing group III nitride substrate to be used as a substrate for a semiconductor device. The free-standing group III nitride substrate has a diameter of 25 mm or more and 160 mm or less and a thickness of 100 μm or more and 1000 μm or less. It discloses, as a specific example thereof, a free-standing GaN substrate having a diameter of 100 mm and a thickness of 400 μm.

Japanese Patent Laying-Open No. 2008-010766 discloses a GaN-thin-film-bonded substrate to be used as a substrate for manufacturing a semiconductor device. The GaN-thin-film-bonded substrate includes a heterogeneous substrate whose chemical composition is different from that of GaN, and a GaN thin film having a thickness of 0.1 μm or more and 100 μm or less and bonded to the heterogeneous substrate. It discloses, as a specific example thereof, a GaN-thin-film-bonded substrate having a diameter of 50.8 mm and including a sapphire substrate and a GaN thin film having a thickness of 0.1 μm or 100 μm and bonded to the sapphire substrate.

Japanese Patent Laying-Open No. 2010-182936 discloses a composite substrate to be used as a substrate for a semiconductor device. The composite substrate includes a support substrate, a nitride semiconductor layer, and a joint layer disposed between the support substrate and the nitride semiconductor layer. It discloses, as a specific example thereof, a composite substrate having a diameter of 50.8 mm and including a sapphire substrate, a GaN layer, and a joint layer formed by press fitting between the substrate and the GaN layer, in which the GaN layer has a thickness of 5 to 220 μm.

SUMMARY OF THE INVENTION

The free-standing group III nitride substrate disclosed in Japanese Patent Laying-Open No. 2009-126722 involves problems that the substrate is manufactured at high cost and therefore very expensive, and that the substrate is likely to crack, resulting in difficulty in increasing the diameter of the substrate and decreasing the thickness thereof.

Regarding the GaN-thin-film-bonded substrate having the GaN thin film of 0.1 μm in thickness as disclosed in Japanese Patent Laying-Open No. 2008-010766, ion implantation is performed to form the GaN thin film, which, however, involves a problem that the ion implantation degrades the crystal quality of the GaN thin film. In order to enhance the characteristics of the semiconductor device to be formed, the thickness of the GaN thin film is preferably 10 μm or more. An increase in thickness of the GaN thin film, however, involves a problem that the variation in depth to which ions are implanted from the main surface increases, which accordingly increases the variation in thickness of the GaN thin film in the resultant GaN-thin-film-bonded substrate.

Regarding the GaN-thin-film-bonded substrate having the GaN thin film of 100 μm in thickness as disclosed in Japanese Patent Laying-Open No. 2008-010766 as well as the composite substrate having the GaN layer of 5 μm to 220 μm in thickness as disclosed in Japanese Patent Laying-Open No. 2010-182936, both these substrates have a diameter on the order of 50.8 mm. Increase of the diameter, however, involves a problem that the variation, within the main surface, of the thickness of the GaN thin film or the GaN layer increases.

In the case where a heterogeneous substrate such as sapphire substrate whose chemical composition and thermal expansion coefficient are different from those of a group III nitride substrate is prepared and a thick group III nitride film is grown on the heterogeneous substrate, there arises problems that large warp occurs and cracks are made.

The present invention has been made to solve the problems above and an object of the invention is to provide a low-cost and large-diameter group III nitride composite substrate including a group III nitride film having a large thickness, a small thickness variation, and a high crystal quality, a method for manufacturing the group III nitride composite substrate, a laminated group III nitride composite substrate, and a group III nitride semiconductor device and a method for manufacturing the same.

According to an aspect, the present invention provides a group III nitride composite substrate with a diameter of 75 mm or more including a support substrate and a group III nitride film having a thickness of 10 μm or more and 250 μm or less that are bonded to each other, a ratio $s_t/m_t$ of a standard deviation $s_t$ of the thickness of the group III nitride film, to a mean value $m_t$ of the thickness thereof being 0.001 or more and 0.2 or less, and a ratio $s_o/m_o$ of a standard deviation $s_o$ of an absolute value of an off angle between a main surface of the group III nitride film and a plane of a predetermined plane orientation, to a mean value $m_o$ of the absolute value of the off angle thereof being 0.005 or more and 0.6 or less.

Regarding the group III nitride composite substrate according the above aspect of the present invention, the group III nitride composite substrate may have a warp of 50 μm or less on the main surface of the group III nitride film, and the group III nitride composite substrate may have a total thickness variation (TTV hereinafter) of 30 μm or less. Further, a ratio $\alpha_{III\text{-}N}/\alpha_S$ of a thermal expansion coefficient $\alpha_{III\text{-}N}$ of the group III nitride film to a thermal expansion coefficient $\alpha_s$ of the support substrate may be 0.75 or more and 1.25 or less, and a ratio $t_{III\text{-}N}/t_S$ of a thickness $t_{III\text{-}N}$ of the group III nitride film to a thickness $t_s$ of the support substrate may be 0.02 or more and 1 or less. Further, impurity metal atoms of the main surface of the group III nitride film may be $3 \times 10^{12}$ atoms/cm$^2$ or less. Further, the main surface of the group III nitride film may have a root mean square roughness (RMS hereinafter) of 3 nm or less. Further, a main surface of the support substrate may have an RMS of 12 nm or less. Further, the group III nitride composite substrate may have a diameter of 100 mm or more, or may have a diameter of 125 mm or more and 300 mm or less. Further, the main surface of the group III nitride film may have a mean value $m_{III\text{-}N}$ of the RMS of 0.1 nm or more and 2 nm or less, and a standard deviation $s_{III\text{-}N}$ of the RMS of 0.4 nm or less, and a main surface of the support substrate may have a mean value $m_S$ of the RMS of 0.3 nm or more and 10 nm or less, and a standard deviation $s_S$ of the RMS of 3 nm or less.

According to another aspect, the present invention provides a laminated group III nitride composite substrate including the group III nitride composite substrate according to the above aspect, and at least one group III nitride layer disposed on the group III nitride film of the group III nitride composite substrate.

According to still another aspect, the present invention provides a group III nitride semiconductor device including the group III nitride film in the group III nitride composite substrate according to the above aspect, and at least one group III nitride layer disposed on the group III nitride film.

According to a further aspect, the present invention provides a method for manufacturing a group III nitride composite substrate according to the above aspect, including the steps of: forming a joined substrate with a diameter of 75 mm or more by bonding a support substrate and a group III nitride film donor substrate to each other; and forming the group III nitride composite substrate by cutting the group III nitride film donor substrate in the joined substrate along a plane located inwardly at a predetermined distance from a bonded main surface of the group III nitride film donor substrate.

According to a still further aspect, the present invention provides a method for manufacturing a group III nitride composite substrate according to the above aspect, including the steps of: forming a joined substrate with a diameter of 75 mm or more by bonding a support substrate and a group III nitride film donor substrate to each other; and forming the group III nitride composite substrate by performing at least one of grinding, polishing, and etching on a main surface of the group III nitride film donor substrate in the joined substrate, the main surface being opposite to a bonded main surface of the group III nitride film donor substrate.

According to a still further aspect, the present invention provides a method for manufacturing a group III nitride semiconductor device, including the steps of: preparing a group III nitride composite substrate according to the above aspect; and growing at least one group III nitride layer on the group III nitride film of the group III nitride composite substrate.

The method for manufacturing a group III nitride semiconductor device according to this aspect of the invention may further include the steps of: bonding a device support substrate onto the group III nitride layer; and removing the support substrate from the group III nitride composite substrate.

The present invention can provide a low-cost and large-diameter group III nitride composite substrate including a group III nitride film having a large thickness, a small thickness variation, and a high crystal quality, a method for manufacturing the group III nitride composite substrate, a laminated group III nitride composite substrate, and a group III nitride semiconductor device and a method for manufacturing the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment: Group III Nitride Composite Substrate]

Figure 1:
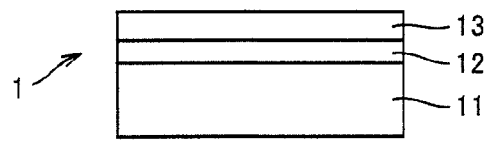
FIG. 1 a schematic cross-sectional view showing an example of the group III nitride composite substrate according to the present invention.

Referring to FIG. 1, a group III nitride composite substrate 1 which is an embodiment of the present invention is a group III nitride composite substrate 1 with a diameter of 75 mm or more including a support substrate 11 and a group III nitride film 13 having a thickness of 10 μm or more and 250 μm or less that are bonded to each other. The ratio $s_t/m_t$ of a standard deviation $s_t$ of the thickness of group III nitride film 13, to a mean value $m_t$ of the thickness thereof is 0.001 or more and 0.2 or less, and the ratio $s_o/m_o$ of a standard deviation $s_o$ of an absolute value of an off angle between a main surface of group III nitride film 13 and a plane of a predetermined plane orientation, to a mean value $m_o$ of the absolute value of the off angle thereof is 0.005 or more and 0.6 or less.

Group III nitride composite substrate 1 of the present embodiment has a diameter of 75 mm or more, group III nitride film 13 bonded onto support substrate 11 has a thickness of 10 μm or more and 250 μm or less, the ratio $s_t/m_t$ of standard deviation $s_t$ of the thickness of group III nitride film 13, to mean value $m_t$ of the thickness thereof is 0.001 or more and 0.2 or less, and the ratio $s_o/m_o$ of standard deviation $s_o$ of an absolute value of an off angle between a main surface of group III nitride film 13 and a plane of a predetermined plane orientation, to mean value $m_o$ of the absolute value of the off angle thereof is 0.005 or more and 0.6 or less. Accordingly, on group III nitride film 13, at least one group III nitride layer having a large diameter and a high crystal quality can be grown, and therefore, group III nitride semiconductor devices having excellent characteristics can be produced at a high yield.

Regarding group III nitride composite substrate 1 of the present embodiment, the manner in which support substrate 11 and group III nitride film 13 are bonded to each other is not particularly limited. In order to increase the joint strength of the bonding, however, it is preferable to provide a joint film 12 between the support substrate and the group III nitride film.

<Diameter of Group III Nitride Composite Substrate>

In order to produce a greater number of semiconductor device chips from one composite substrate, the diameter of group III nitride composite substrate 1 is 75 mm or more, and is preferably 100 mm or more, more preferably 125 mm or more, and still more preferably 150 mm or more. Meanwhile, in order to reduce the warp of the composite substrate and increase the yield of semiconductor devices, the diameter of group III nitride composite substrate 1 is preferably 300 mm or less, and more preferably 200 mm or less.

<Warp on the Group III Nitride Film Side of Group III Nitride Composite Substrate>

In order to increase the yield of semiconductor devices to be formed, group III nitride composite substrate 1 has a warp, on the group III nitride film 13 side, of preferably 50 μm or less, more preferably 30 μm or less, and still more preferably 20 μm or less. Here, the warp on the group III nitride film 13 side of group III nitride composite substrate 1 is calculated in the following way. With respect to a least square plane where the sum of respective squares of the distances from the least square plane to any points within the main surface of group III nitride film 13 is a minimum value, the distance between the least square plane and a point on the main surface that is located furthest away in one direction from the least square plane and the distance between the least square plane and a point on the main surface that is located furthest away in the other direction from the least square plane are added together. The value of this sum represents the warp. The warp is measured by means of an interferometric flatness tester, a laser displacement meter, or the like.

<TTV of Group III Nitride Composite Substrate>

In order to increase the yield of semiconductor devices to be formed, the TTV (Total Thickness Variation which is one of indices used for evaluating the flatness and also called GBIR (Global Backside Ideal Range)) of group III nitride composite substrate 1 is preferably 30 μm or less, more preferably 20 μm or less, and still more preferably 10 μm or less. Here, the TTV of group III nitride composite substrate 1 is the difference between the maximum value and the minimum value, within the whole main surface of group III nitride film 13, of the distance measured in the thickness direction from a reference plane, which is a main surface of support substrate 11 and is the rear surface of group III nitride composite substrate 1, to the main surface of group III nitride film 13, which is the front surface of group III nitride composite substrate 1. Specifically, the TTV is the difference between the highest level and the lowest level of the main surface of group III nitride film 13, which is the front surface of group III nitride composite substrate 1, relative to the reference plane, which is the main surface of support substrate 11, namely the rear surface of group III nitride composite substrate 1, and corrected to be flat. The level difference is measured by means of an interferometric flatness tester, a laser displacement meter, or the like.

<Relation between Support Substrate and Group III Nitride Film in Group III Nitride Composite Substrate>

In order to reduce warp and cracks of group III nitride composite substrate 1 and of a group III nitride layer to be grown on group III nitride film 13, the ratio $\alpha_{III\text{-}N}/\alpha_S$ of thermal expansion coefficient $\alpha_{III\text{-}N}$ of the group III nitride film to thermal expansion coefficient $\alpha_S$ of the support substrate is preferably 0.75 or more and 1.25 or less, more preferably 0.8 or more and 1.2 or less, still more preferably 0.9 or more and 1.1 or less, and particularly preferably 0.95 or more and 1.05 or less.

In order to reduce warp and cracks of group III nitride composite substrate 1 and of a group III nitride layer to be grown on group III nitride film 13, the ratio $t_{III\text{-}N}/t_S$ of thickness $t_{III\text{-}N}$ of the group III nitride film to thickness $t_s$ of the support substrate is preferably 0.02 or more and 1 or less, more preferably 0.06 or more and 0.7 or less, still more preferably 0.15 or more and 0.5 or less, and particularly preferably 0.2 or more and 0.4 or less.

<Support Substrate>

Support substrate 11 is not particularly limited as long as support substrate 11 can support group III nitride film 13. In order to reduce the amount of use of the expensive group III nitride to thereby lower the cost, however, the support substrate is preferably a hetero-composition substrate whose chemical composition is different from that of the group III nitride. Further, since it is preferable as described above that the ratio $\alpha_{III\text{-}N}/\alpha_S$ of thermal expansion coefficient $\alpha_{III\text{-}N}$ of group III nitride film 13 to thermal expansion coefficient $\alpha_s$ of support substrate 11 is 0.75 or more and 1.25 or less, support substrate 11 is preferably a substrate formed of mullite ($3Al_2O_3 \cdot 2SiO_2\text{-}2Al_2O_3 \cdot SiO_2$), a substrate formed of mullite-YSZ (Yttria Stabilized Zirconia), a substrate formed of spinel ($MgAl_2O_4$), a substrate formed of a sintered body of an $Al_2O_3$—$SiO_2$-based composite oxide, and substrates formed respectively of sintered bodies of them to which oxide, carbonate or the like is added, a molybdenum (Mo) substrate, a tungsten (W) substrate, or the like. Here, preferred elements to be contained in the oxide and the carbonate are Ca, Mg, Sr, Ba, Al, Sc, Y, Ce, Pr, Si, Ti, Zr, V, Nb, Ta, Cr, Mn, Fe, Co, Ni, Cu, Zn, and the like.

The RMS (Root Mean Square roughness) of the main surface of support substrate 11 in group III nitride composite substrate 1 is preferably 12 nm or less, more preferably 6 nm or less, and still more preferably 2 nm or less, in order to enhance the crystal quality of a group III nitride layer to be grown on group III nitride film 13 of group III nitride composite substrate 1. Here, the RMS of the main surface of support substrate 11 can be adjusted by polishing both the main surfaces of support substrate 11 before group III nitride film 13 is bonded to support substrate 11, or polishing, after group III nitride film 13 is bonded to support substrate 11, the other main surface to which group III nitride film 13 is not bonded. Here, the RMS of the main surface of support substrate 11 is determined in the following way. From points on the main surface of support substrate 11, a reference plane is calculated, and the positive square root of the mean of respective squares of the distances from the aforementioned points to the reference plane is determined. The value of the determined positive square root is the RMS, which is measured by means of an AFM (Atomic Force Microscope), an interferometric roughness meter, a stylus-based roughness meter, or the like.

The main surface of support substrate 11 preferably has a mean value $m_S$ of the RMS of 0.3 nm or more and 10 nm or less, and a standard deviation $s_S$ of the RMS of 3 nm or less. In the case where the main surface of support substrate 11 has a mean value $m_s$ of the RMS of 10 nm or less and a standard deviation $s_S$ of the RMS of 3 nm or less, a group III nitride layer of high crystal quality can be grown on the whole main surface of group III nitride film 13 and accordingly semiconductor devices can be produced at a high yield. In order for the main surface of support substrate 11 to have a mean value $m_S$ of the RMS of less than 0.3 nm, sophisticated surface polishing is necessary, which increases the cost to a considerable degree. In view of the above, mean value $m_S$ of the RMS of the main surface of support substrate 11 is more preferably 0.3 nm or more and 5 nm or less, and still more preferably 0.3 nm or more and 2 nm or less. In addition, standard deviation $s_S$ of the RMS of the main surface of support substrate 11 is more preferably 2 nm or less, and still more preferably 1 nm or less.

Figure 2:
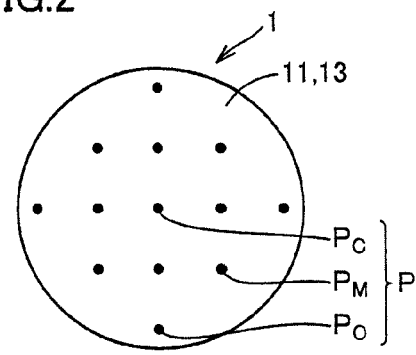
FIG. 2 is a schematic plan view showing measurement points at which measurements of physical properties are taken in the group III nitride composite substrate.

Here, mean value $m_S$ and standard deviation $s_S$ of the RMS of the main surface of support substrate 11 are respectively the arithmetic mean and the standard deviation that are calculated from the RMS measured at the 13 measurement points on the main surface of support substrate 11 shown in FIG. 2. The 13 measurement points P on the main surface of support substrate 11 shown in FIG. 2 are constituted, regardless of the magnitude of the diameter of support substrate 11: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$. The standard deviation here refers to the positive square root of unbiased variance.

<Joint Film>

Joint film 12 is not particularly limited as long as joint film 12 can join support substrate 11 and group III nitride film 13 to each other. Joint film 12 is preferably $SiO_2$ film, $Si_3N_4$ film, $TiO_2$ film, $Ga_2O_3$ film, or the like because these films have a high joining ability for joining support substrate 11 and group III nitride film 13 to each other.

<Group III Nitride Film>

Group III nitride film 13 is a film formed of a group III nitride, specifically an $In_xAl_yGa_{1-x-y}N$ film ($0 \leq x$, $0 \leq y$, $x+y \leq 1$) such as GaN film, AlN film, or the like.

In order to form a group III nitride semiconductor device having excellent characteristics, the thickness of group III nitride film 13 is 10 μm or more, which is preferably 30 μm or more, more preferably 50 μm or more, and still more preferably 100 μm or more. Meanwhile, in order to reduce the amount of use of the expensive group III nitride, the thickness of group III nitride film 13 is 250 μm or less, which is preferably 200 μm or less, and more preferably 170 μm or less, and particularly preferably 150 μm or less.

The ratio $s_t/m_t$ of standard deviation $s_t$ of the thickness of group III nitride film 13, to mean value $m_t$ of the thickness thereof is 0.001 or more and 0.2 or less, which is preferably 0.001 or more and 0.15 or less, more preferably 0.002 or more and 0.1 or less, and still more preferably 0.01 or more and 0.05 or less. In order to make the ratio $s_t/m_t$ smaller than 0.001, it is necessary to perform cutting and polishing and thereby precisely control the thickness, which increases the cost. On the contrary, if the ratio $s_t/m_t$ is higher than 0.2, the uniformity of the film thickness is deteriorated, which degrades the characteristics of semiconductor devices to be produced.

The ratio $s_o/m_o$ of standard deviation $s_o$ of an absolute value of an off angle between the main surface of group III nitride film 13 and a plane of a predetermined plane orientation, to mean value $m_o$ of the absolute value of the off angle thereof is 0.005 or more and 0.6 or less, which is preferably 0.005 or more and 0.5 or less, more preferably 0.008 or more and 0.4 or less, and still more preferably 0.05 or more and 0.2 or less. In order to make the ratio $s_o/m_o$ smaller than 0.005, it is necessary to perform cutting and polishing and thereby precisely control the off angle, which increases the cost. On the contrary, if the ratio $s_o/m_o$ is higher than 0.6, a portion where the morphology of a group III nitride layer formed on group III nitride film 13 is deteriorated is generated within the main surface. In addition, the variation, within the main surface, of the amount of impurities taken into the main surface is large, which reduces the yield of semiconductor devices to be produced.

The crystal structure of group III nitride film 13 is preferably the wurtzite structure, since it enables semiconductor devices having excellent characteristics to be produced. The above-referenced predetermined plane orientation to which the main surface of group III nitride film 13 is closest is not limited as long as it is suitable for a desired semiconductor device, and may be any of {0001}, {10-10}, {11-20}, {21-30}, {20-21}, {10-11}, {11-22}, and {22-43}, as well as plane orientations that are 15° or less off from these plane orientations, respectively. It may also be any of the plane orientations opposite to the above-listed plane orientations, as well as plane orientations that are 15° or less off from these plane orientations, respectively. Namely, group III nitride film 13 may be any of polar plane, nonpolar plane, and semipolar plane. The main surface of group III nitride film 13 is preferably any of the {0001} plane and the opposite plane thereof, since such planes make it easy to increase the diameter, or any of {10-10} plane, {20-21} plane, and the opposite planes thereof, since such planes suppress blue shift of a light-emitting device to be produced.

Here, regarding group III nitride film 13, mean value $m_t$ of the thickness, standard deviation $s_t$ of the thickness, mean value $m_o$ of the absolute value of the off angle, and standard deviation $s_o$ of the absolute value of the off angle, are values of the arithmetic mean and the standard deviation calculated from respective measurements of the thickness and respective measurements of the off angle that are taken at the 13 measurement points on the main surface of group III nitride film 13 shown in FIG. 2. The 13 measurement points P on the main surface of group III nitride film 13 shown in FIG. 2 are constituted, regardless of the magnitude of the diameter of the group III nitride film: one central point $P_C$; four outer points $P_o$ located respectively in the four directions with respect to central point $P_C$ that are orthogonal to each other, the outer points each being located at 5 mm inward from the outer edge; and eight middle points $P_M$ including four middle points each between the one central point $P_C$ and one of the four outer points $P_O$ and four middle points each between two of the four outer points $P_O$. The standard deviation here refers to the positive square root of unbiased variance.

In order to enhance the crystal quality of a group III nitride layer to be grown on group III nitride film 13 and enhance the characteristics of semiconductor devices to be formed, impurity metal atoms of the main surface of group III nitride film 13 are preferably $3 \times 10^{12}$ atoms/$cm^2$ or less, more preferably $4 \times 10^{11}$ atoms/$cm^2$ or less, and still more preferably $1 \times 10^{11}$ atoms/$cm^2$ or less. As for other impurities of the surface of group III nitride film 13, Cl atoms are preferably $2 \times 10^{14}$ atoms/$cm^2$ or less, and Si atoms are preferably $9 \times 10^{13}$ atoms/$cm^2$ or less, in order to enhance the crystal quality of a group III nitride layer to be grown on group III nitride film 13 and enhance the characteristics of semiconductor devices to be formed.

In order to enhance the crystal quality of a group III nitride layer to be grown on group III nitride film 13, the RMS of the main surface of group III nitride film 13 is preferably 3 nm or less, more preferably 2 nm or less, and still more preferably 1 nm or less.

Preferably, the main surface of group III nitride film 13 has a mean value $m_{III-N}$ of the RMS of 0.1 nm or more and 2 nm or less, and a standard deviation $s_{III-N}$ of the RMS of 0.4 nm or less. In the case where the main surface of group III nitride film 13 has a mean value $m_{III-N}$ of the RMS of 2 nm or less and a standard deviation $s_{III-N}$ of the RMS of 0.4 nm or less, a group III nitride layer of high crystal quality can be grown on the whole main surface of group III nitride film 13, and accordingly, semiconductor devices can be produced at a high yield. In order for the main surface of group III nitride film 13 to have a mean value of the RMS of less than 0.1 nm, sophisticated surface polishing is necessary, which increases the cost to a considerable degree. In view of the above, mean value $m_{III-N}$ of the RMS of the main surface of group III nitride film 13 is more preferably 0.1 nm or more and 1.5 nm or less, and still more preferably 0.2 nm or more and 1 nm or less. In addition, the main surface of group III nitride film 13 has a standard deviation $s_{III-N}$ of the RMS of more preferably 0.3 nm or less, and still more preferably 0.2 nm or less.

Here, the mean value $m_{III-N}$ and the standard deviation $s_{III-N}$ of the RMS of the main surface of group III nitride film 13 are respectively the arithmetic mean and the standard deviation that are calculated from the RMS measured at the 13 measurement points on the main surface of group III nitride film 13 shown in FIG. 2, as described above. Moreover, regarding group III nitride film 13, its dislocation density is preferably $1 \times 10^8$ cm$^{-2}$ or less, and its carrier concentration is preferably $1 \times 10^{17}$ cm$^{-3}$ or more.

[Second Embodiment: Laminated Group III Nitride Composite Substrate]

Figure 3:
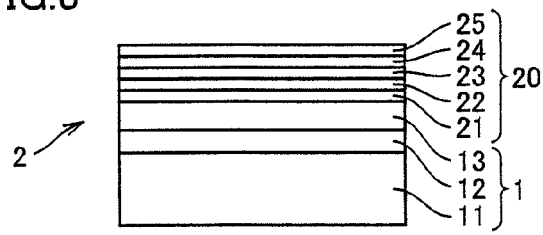
FIG. 3 is a schematic cross-sectional view showing an example of the laminated group III nitride composite substrate according to the present invention.

Referring to FIG. 3, a laminated group III nitride composite substrate 2 which is another embodiment of the present invention includes group III nitride composite substrate 1 of the first embodiment, and at least one group III nitride layer 20 disposed on group III nitride film 13 of group III nitride composite substrate 1.

In laminated group III nitride composite substrate 2 of the present embodiment, group III nitride layer 20 disposed by being grown on group III nitride film 13, which has a high crystal quality as well as a small thickness variation and a small off-angle variation, also has a high crystal quality. Therefore, semiconductor devices having excellent characteristics can be produced at a high yield.

In laminated group III nitride composite substrate 2 of the present embodiment, group III nitride layer 20 disposed on group III nitride film 13 varies depending on the type of the semiconductor device to be produced. In the case where the semiconductor device to be produced is a light-emitting device, group III nitride layer 20 may be configured to include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25. In the case where the semiconductor device to be produced is an HEMT (High Electron Mobility Transistor) which is an example of electronic devices, the group III nitride layer may be configured to include, for example, a GaN layer and an Al$_{0.2}$Ga$_{0.8}$N layer. In the case where the semiconductor device to be produce is an SBD (Schottky Barrier Diode) which is another example of electronic devices, the group III nitride layer may be configured to include, for example, an n$^+$-GaN layer (having a carrier concentration for example of $2 \times 10^{18}$ cm$^{-3}$) and an n$^-$-GaN layer (having a carrier concentration for example of $5 \times 10^{15}$ cm$^{-3}$).

[Third Embodiment: Group III Nitride Semiconductor Device]

Figure 4:
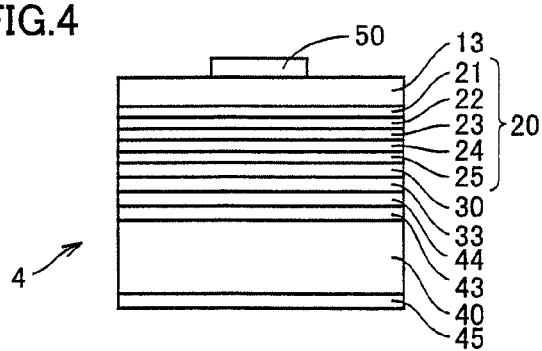
FIG. 4 is a schematic cross-sectional view showing an example of the group III nitride semiconductor device according to the present invention.
Figure 5:
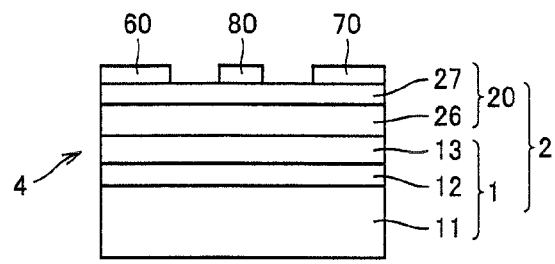
FIG. 5 is a schematic cross-sectional view showing another example of the group III nitride semiconductor device according to the present invention.

Referring to FIGS. 4 and 5, a group III nitride semiconductor device 4 which is still another embodiment of the present invention includes group III nitride film 13 in the group III nitride composite substrate of the first embodiment, and at least one group III nitride layer 20 disposed on group III nitride film 13.

Group III nitride semiconductor device 4 of the present embodiment includes group III nitride film 13 which has a high crystal quality as well as a small thickness variation and a small off-angle variation, and group III nitride layer 20 of high crystal quality disposed by being grown on group III nitride film 13, and therefore has excellent characteristics.

In group III nitride semiconductor device 4, group III nitride layer 20 varies depending on the type of group III nitride semiconductor device 4. Referring to FIG. 4, in the case where group III nitride semiconductor device 4 is a light-emitting device, group III nitride layer 20 may be configured to include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25. Referring to FIG. 5, in the case where group III nitride semiconductor device 4 is an HEMT which is an example of electronic devices, group III nitride layer 20 may be configured to include, for example, a GaN layer 26 and an Al$_{0.2}$Ga$_{0.8}$N layer. In the case where the semiconductor device is an SBD which is another example of electronic devices, the group III nitride layer may be configured to include, for example, an n$^+$-GaN layer (having a carrier concentration for example of $2 \times 10^{18}$ cm$^{-3}$) and an n$^-$-GaN layer (having a carrier concentration for example of $5 \times 10^{15}$ cm$^{-3}$).

Preferably, group III nitride semiconductor device 4 further includes at least one of support substrate 11 and a device support substrate 40 for supporting group III nitride layer 20. Here, the shape of device support substrate 40 is not limited to the shape of a flat plate, and may be any as long as it supports group III nitride film 13 and group III nitride layer 20 so that group III nitride semiconductor device 4 can be formed.

[Fourth Embodiment: Method for Manufacturing Group III Nitride Composite Substrate]

Figure 6:
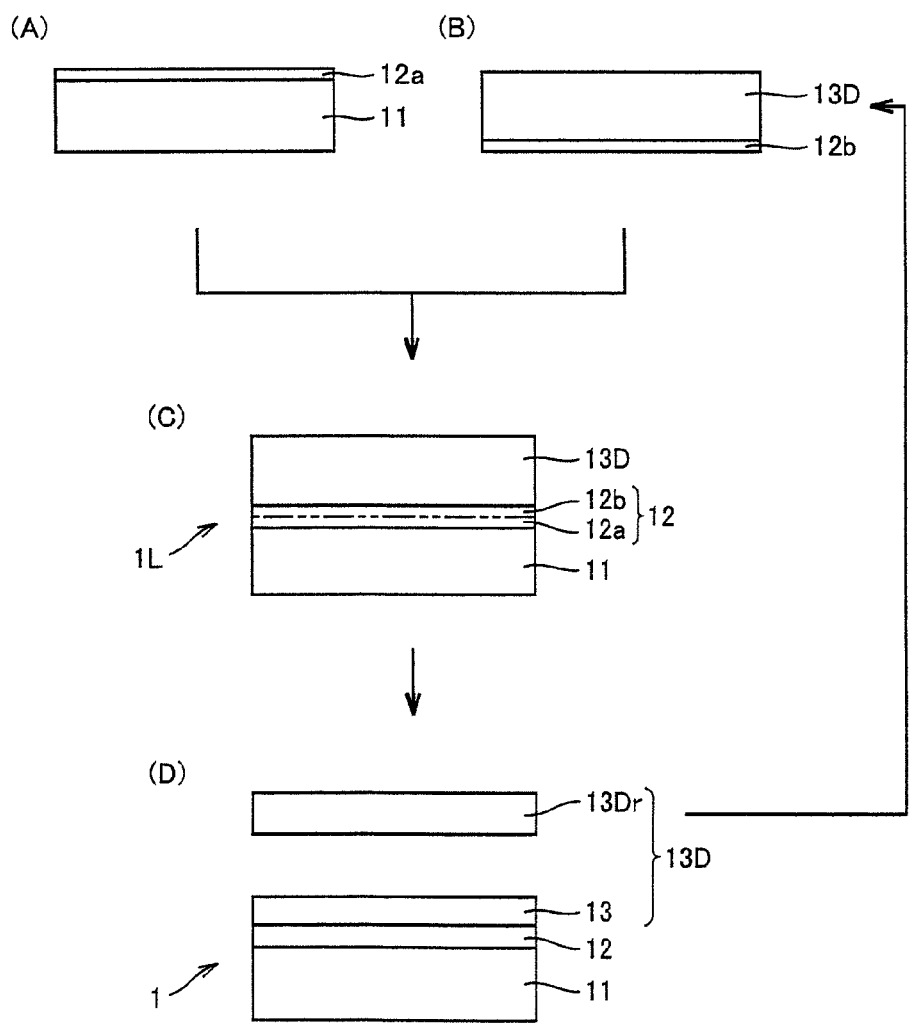
FIG. 6 is a schematic cross-sectional view showing an example of the method for manufacturing a group III nitride composite substrate according to the present invention.
Figure 7:
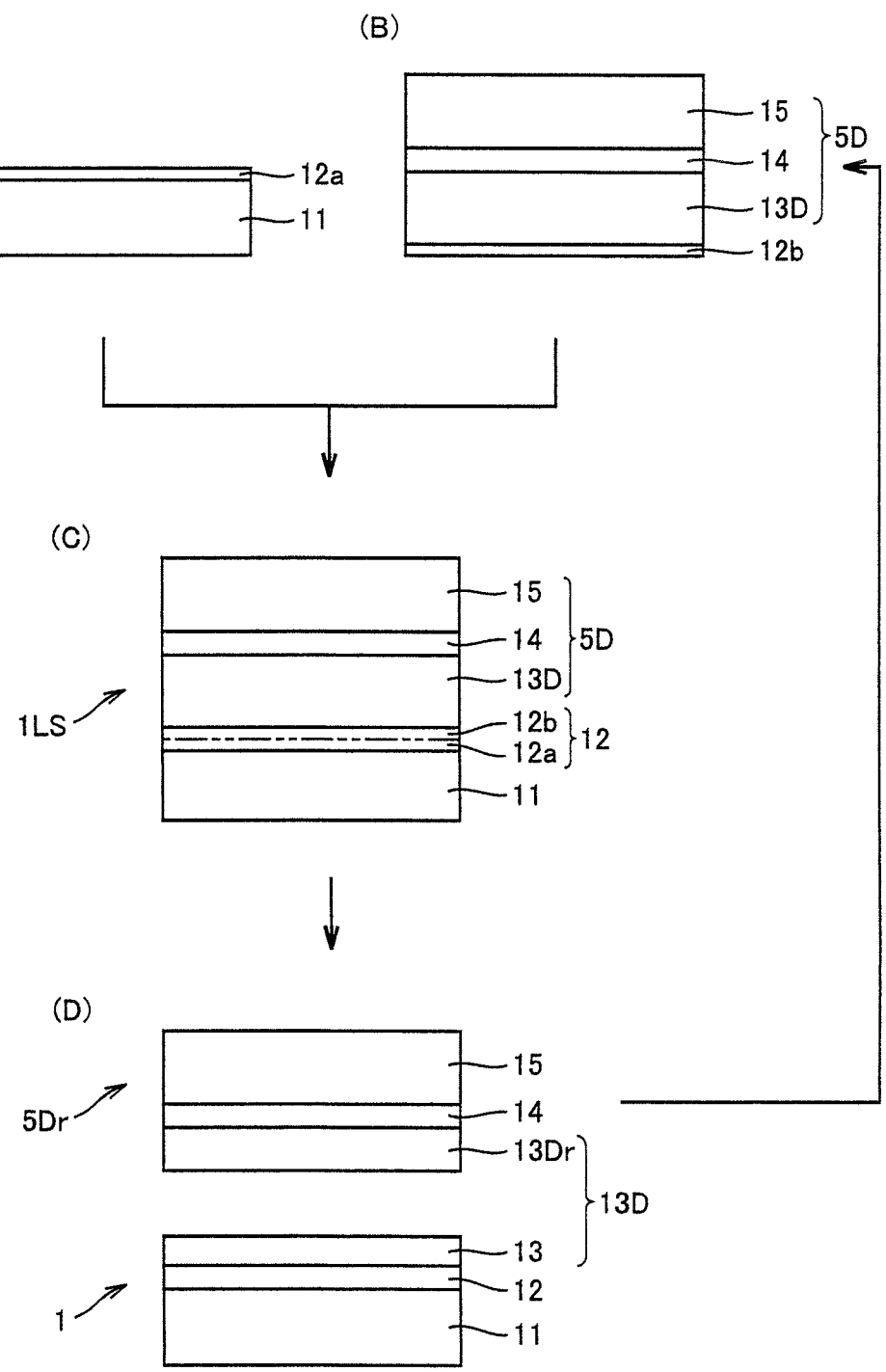
FIG. 7 is a schematic cross-sectional view showing another example of the method for manufacturing a group III nitride composite substrate according to the present invention.

Referring to FIGS. 6 and 7, a method for manufacturing a group III nitride composite substrate which is a further embodiment of the present invention is a method for manufacturing group III nitride composite substrate 1 of the first embodiment, including the steps of: forming a joined substrate 1L, 1LS having a diameter of 75 mm or more by bonding support substrate 11 and a group III nitride film donor substrate 13D to each other (FIG. 6(A) to (C) and FIG. 7(A) to (C)); and forming group III nitride composite substrate 1 by cutting group III nitride film donor substrate 13D in joined substrate 1L, 1LS along a plane located inwardly at a predetermined distance from the bonded main surface of group III nitride film donor substrate 13D (FIG. 6(D), FIG. 7(D)).

The method for manufacturing a group III nitride composite substrate of the present embodiment can efficiently manufacture low-cost and large-diameter group III nitride composite substrate 1 including a group III nitride film having a large thickness and a high crystal quality.

Here, in the step of forming group III nitride composite substrate 1, the predetermined distance of the plane located inwardly from the bonded main surface of group III nitride film donor substrate 13D, for cutting group III nitride film donor substrate 13D along the plane at this distance, is determined depending on the thickness of group III nitride film 13 of group III nitride composite substrate 1 to be manufactured.

In addition, in the step of forming group III nitride composite substrate 1, group III nitride film donor substrate 13D is cut to form group III nitride film 13, and thereafter at least one of grinding, polishing, and etching can be performed on the main surface of group III nitride film 13 opposite to the bonded main surface thereof, to thereby reduce the thickness of group III nitride film 13. In particular, in order to reduce the thickness variation and the off-angle variation of group III nitride film 13 which is formed by cutting group III nitride film donor substrate 13D, it is preferable to polish the main surface, which has been obtained by the cutting, of group III nitride film 13 in group III nitride composite substrate 1. In order to reduce the thickness variation and the off-angle variation of group III nitride film 13, the method for polishing is preferably precision polishing based on CMP (Chemical Mechanical Polishing), chemical polishing, or the like.

In view of the above, the predetermined distance of the plane located inwardly from the bonded main surface of group III nitride film donor substrate 13D, for cutting group III nitride film donor substrate 13D along the plane at this distance, is preferably the sum determined by adding a polishing allowance, which is a portion to be removed away by polishing, to the thickness of group III nitride film 13 of group III nitride composite substrate 1 to be manufactured.

Regarding the method for manufacturing group III nitride composite substrate 1 of the present embodiment, group III nitride film donor substrate 13D is cut along a plane located inwardly at a predetermined distance from the bonded main surface of group III nitride film donor substrate 13D in joined substrate 1L, 1LS, and preferably at least one of grinding, polishing, and etching is performed on the main surface which is opposite to the bonded main surface of group III nitride film donor substrate 13D, to thereby adjust the film thickness by reducing it. Accordingly, group III nitride composite substrate 1 including group III nitride film 13 having a desired thickness of 10 μm or more and 250 μm or less can be obtained.

As for the method for manufacturing group III nitride composite substrate 1 of the present embodiment, the group III nitride film donor substrate is cut in the step of forming the group III nitride composite substrate. Thus, in order to improve the workability and the efficiency of manufacture, the thickness of group III nitride film donor substrate 13D to be used is preferably larger than 500 μm, more preferably 1 mm or more, and still more preferably 2 mm or more.

<Step of Forming Joined Substrate>

Referring to FIG. 6(A) to (C) and FIG. 7(A) to (C), the step of forming joined substrate 1L, 1LS includes the sub step of forming a joint film 12a on the main surface of support substrate 11 (FIG. 6(A), FIG. 7(A)), the sub step of forming a joint film 12b on the main surface of group III nitride film donor substrate 13D (FIG. 6(B), FIG. 7(B)), and bonding joint film 12a formed on support substrate 11 and joint film 12b formed on group III nitride film donor substrate 13D to each other (FIG. 6(C), FIG. 7(C)).

Referring to FIG. 6(A) and FIG. 7(A), in the sub step of forming joint film 12a on the main surface of support substrate 11, joint film 12a is to be integrated with joint film 12b, which will be described later herein, to form joint film 12, and is made of the same material as joint film 12. The method for forming joint film 12a is not particularly limited as long as the method is suitable for forming joint film 12a. In order to efficiently form joint film 12a of good quality, however, the method is preferably sputtering, CVD (Chemical Vapor Deposition), PLD (Pulsed Laser Deposition), MBE (Molecular Beam Epitaxy), electron-beam deposition, or the like. CVD is particularly preferred since it enhances the quality of the joint film and enhances the film deposition rate. Among different CVD methods, P-CVD (Plasma-Chemical Vapor Deposition), PE-CVD (Plasma Enhanced-Chemical Vapor Deposition), and the like are more preferred since they enable the film to be deposited at a low temperature and at a high deposition rate, and LP-CVD (Low Pressure-Chemical Vapor Deposition) and the like are still more preferred since they enhance the film quality and facilitate mass production.

Further, in order to improve the joint strength, annealing may be performed after joint films 12a, 12b are formed and before they are joined together. This annealing can degas joint films 12a, 12b to thereby densify joint films 12a, 12b.

Furthermore, in order to increase the joint strength between support substrate 11 and group III nitride film donor substrate 13D, the main surface of joint film 12a is preferably mirror-polished (into a mirror-finished surface having an RMS of 0.3 nm or less). The method for polishing the main surface of joint film 12a is not particularly limited. For example, CMP (Chemical Mechanical Polishing) or the like is used. In order to improve the cleanliness of the joint film for the purpose of increasing the joint strength, non-abrasive polishing may be performed, after CMP, with a solution containing no abrasive. In order to enhance the effect of removing the abrasive, non-abrasive polishing may be performed by means of an alkali such as KOH, TMAH (tetramethylammonium hydroxide), or an acid such as HCl, $HNO_3$, $H_2SO_4$. In addition, in order to improve the cleanliness of the joint film for the purpose of increasing the joint strength, scrub cleaning using sponge, brush, or the like may be performed. In addition, two-fluid cleaning, megasonic cleaning, ultrasonic cleaning, or the like may suitably be performed.

Referring to FIG. 6(B) and FIG. 7(B), in the sub step of forming joint film 12b on the main surface of group III nitride film donor substrate 13D, group III nitride film donor substrate 13D is a donor substrate which is to provide group III nitride film 13 after a part thereof is separated in the subsequent sub step. The method for preparing this group III nitride film donor substrate 13D is not particularly limited. In order to produce group III nitride film donor substrate 13D of good crystallinity, suitable methods are gas phase methods such as HVPE (Hydride Vapor Phase Epitaxy), MOVPE (Metal Organic Vapor Phase Epitaxy), MBE (Molecular Beam Epitaxy), and sublimation method, as well as liquid phase methods such as flux method, high nitrogen pressure solution method, ammonothermal method, and the like. Group III nitride film donor substrate 13D prepared in this way is not particularly limited. In order to provide group III nitride film 13 of good crystallinity, the donor substrate preferably has a degree of crystallinity substantially identical to that of group III nitride film 13 to be provided. Specifically, it is preferable that the ratio $s_o/m_o$ of standard deviation $s_o$ of an absolute value of an off angle between the main surface of group III nitride film donor substrate 13D and a plane of a predetermined plane orientation, to a mean value $m_o$ of the absolute value of the off angle thereof is 0.005 or more and 0.6 or less.

The material and the method for forming joint film 12b as well as polishing of the main surface of joint film 12b are similar to the material and the method for forming the above-described joint film 12a as well as polishing of the main surface of joint film 12a.

Referring to FIG. 6(C) and FIG. 7(C), in the sub step of bonding joint film 12a formed on support substrate 11 and joint film 12b formed on group III nitride film donor substrate 13D to each other, the method for bonding them together is not particularly limited. Suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together; a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after the joint films are joined together.

The above bonding causes joint film 12a and joint film 12b to be joined together and thereby integrated into joint film 12. Support substrate 11 and group III nitride film donor substrate 13D are joined together with joint film 12 interposed therebetween to thereby form joined substrate 1L, 1LS.

Respective surfaces of joint films 12a and 12b to be bonded to each other can thus be activated before being bonded to each other, to thereby increase the joint strength. Activation of the surfaces to be bonded is not particularly limited. The surfaces are preferably activated through plasma treatment, ion treatment, chemical treatment by means of a chemical solution, cleaning, CMP treatment, and the like, since they have a high activation effect.

<Step of Forming Group III Nitride Composite Substrate>

Referring to FIG. 6(D) and FIG. 7(D), in the step of forming group III nitride composite substrate 1, group III nitride film donor substrate 13D is cut along a plane located inwardly at a predetermined distance from the bonded main surface of group III nitride film donor substrate 13D in joined substrate 1L, 1LS. Accordingly, the donor substrate is separated into group III nitride film 13, which is joined to support substrate 11 with joint film 12 interposed therebetween, and a remaining group III nitride film donor substrate 13Dr. Thus, group III nitride composite substrate 1 in which support substrate 11 and group III nitride film 13 are bonded to each other with joint film 12 interposed therebetween is formed.

The method for cutting group III nitride film donor substrate 13D is not particularly limited, and may be any of the methods such as wire saw, blade saw, laser processing, electrical discharge processing, water jet, and the like. The wire saw is capable of cutting many pieces at the same time, to thereby enable the cutting cost to be reduced and the machining ability per unit time to be enhanced.

As to cutting of group III nitride film donor substrate 13D by means of a wire saw, it is preferable to use a fixed-abrasive wire in order to flatly cut group III nitride film donor substrate 13D of a large diameter, and it is preferable to use a thin wire in order to reduce a cutting allowance, which is a portion to be removed away through cutting. For reduction of the cutting allowance, loose-abrasive processing is preferred. In addition, as to cutting of group III nitride film donor substrate 13D by means of a wire saw, it is preferable to increase the tension of the wire and increase the wire speed, in order to reduce bending of the wire caused by the cut resistance and thereby improve the thickness precision and the flatness. For this purpose, a high-rigidity wire saw apparatus is preferred.

It is also preferable to swing the wire and vibrate group III nitride film donor substrate 13D in synchronization therewith, in order to reduce the cut resistance and thereby improve the thickness precision and the flatness. Specifically, the cutting resistance can be reduced in the following manner. In the case where the wire saw is positioned at a right angle or an angle close thereto relative to the direction in which group III nitride film donor substrate 13D is cut, group III nitride film donor substrate 13D is moved along the direction in which it is cut. In the case where the wire saw is located at an angle further from the right angle relative to the direction in which group III nitride film donor substrate 13D is cut, group III nitride film donor substrate 13D is moved in the direction opposite to the direction in which it is cut.

The group III nitride such as GaN is more brittle and more prone to crack as compared with sapphire, SiC, and the like, and therefore cannot be cut appropriately by a cutting method similar to that used for sapphire and SiC. It is therefore necessary for cutting of the group III nitride to further reduce the cut resistance. In order to reduce the cut resistance and thereby enhance the thickness precision and the flatness, it is preferable that the resistance coefficient R (N) is within an appropriate range, specifically a range of 4000 or more and 5000 or less. The resistance coefficient R (N) is represented by $(\eta \times Q \times V)/(L \times P \times n)$ where $\eta$ (Pa·s) is the viscosity of a machining fluid for slicing, Q (m$^3$/s) is the flow rate of the machining fluid, V (m/s) is the wire speed, L (m) is the maximum cut length, P (m/s) is the cut speed, and n is the number of workpieces that are cut simultaneously.

<Electrical Discharge Processing>

Group III nitride film donor substrate 13D can be cut by means of electrical discharge processing. Electrical discharge processing causes electrical discharge between group III nitride film donor substrate 13D and a tool electrode (such as wire electrode, rod electrode, shaped electrode, or the like), and uses local heat generated by the discharge to partially remove and thereby process group III nitride film donor substrate 13D. Since the group III nitride material has high hardness and low toughness, mechanical machining is likely cause the group III nitride material to crack or fracture. Therefore, mechanical machining is restricted in terms of the increase of the cutting speed and in terms of the machining ability per unit time. In contrast, electrical discharge processing uses local heat to remove a part of the workpiece for cutting, and therefore can cut the workpiece at high speed even if the workpiece is a group III nitride material of high hardness and low toughness. In addition, electrical discharge processing can use a thin wire for cutting, which is different from mechanical machining using a common wire saw, and therefore can reduce the kerf loss. Electrical discharge processing can thus reduce the loss of the expensive group III nitride material to thereby lower the cost. Moreover, electrical discharge processing does not require diamond abrasive, and can thereby lower the cost.

As the tool electrode for electrical discharge processing, a wire electrode is preferred. As long as a wire used for the wire electrode is electrically conductive, the wire is not particularly limited, and tungsten wire, molybdenum wire, brass wire, brass-coated steel wire (core: steel, coating: brass), zinc-coated brass wire (core: brass, coating: zinc), or brass-and-zinc-coated steel wire (core: steel, inner coating: brass, outer coating: zinc) may be used. Here, the mass ratio between copper (Cu) and zinc (Zn) in the brass, namely Cu:Zn, is preferably 56:44 to 80:20. The wire may include Fe, Sn, Pb and/or other metals. In order to reduce the kerf loss, the diameter of the wire (herein defined as the diameter of the whole wire) is preferably 200 µm or less, more preferably 100 µm or less, and still more preferably 80 µm or less. Meanwhile, in order to reduce the amplitude of vibration of the wire during cutting of group III nitride film donor substrate 13D and thereby reduce the thickness variation in the cut plane, the wire diameter is preferably 50 µm or more, and more preferably 70 µm or more.

For efficient cutting by electrical discharge processing, the resistivity of group III nitride film donor substrate 13D is preferably $1\times10^{-2}$ Ωcm or less. For reduction of its resistivity, group III nitride film donor substrate 13D is preferably doped with oxygen and/or silicon. Different dopants can be used for group III nitride film donor substrate 13D to reduce its resistivity. For example, for a group III nitride film donor substrate 13D in which a facet growth portion and a c-plane growth portion are mixed, the facet growth portion may be doped with oxygen and the c-plane growth portion may be doped with silicon.

The main surface of group III nitride film 13 of group III nitride composite substrate 1 formed by cutting group III nitride film donor substrate 13D may be smoothed by polishing. When a thin group III nitride composite substrate 1 is produced by cutting, a processing damage causes a warp. In order to suppress the warp of group III nitride composite substrate 1 to be produced, support substrate 11 of joined substrate 1L can be bonded and thereby secured to a processing holder and, under this condition, group III nitride film donor substrate 13D can be cut. If joined substrate 1L including warped group III nitride film donor substrate 13D is bonded to the processing holder and processing is performed, there arise a thickness variation and an off-angle variation depending on the warp. Joined substrate 1L including group III nitride film donor substrate 13D which is thick and free of warp can be secured to the processing holder to thereby suppress the warp of group III nitride composite substrate 1 to be formed after cutting. Accordingly, the thickness variation and the off-angle variation of group III nitride composite substrate 1 after being polished can be reduced. In view of this, group III nitride film donor substrate 13D has a thickness of preferably 2 mm or more, more preferably 4 mm or more, and still more preferably 6 mm or more.

For group III nitride composite substrate 1 obtained through the cutting, respective main surfaces of group III nitride film 13 and support substrate 11 can be polished so that a desired thickness, a desired off angle, and the uniformity of them are obtained. Specifically, in order to bond group III nitride composite substrate 1 to a polishing apparatus in a polishing process, group III nitride composite substrate 1 can be secured by means of suction and/or a back pad. Group III nitride composite substrate 1 may also be bonded first to a holding plate and then bonded to a polishing apparatus. For this bonding, mechanical pressurization such as vacuum chuck, air back pressurization, weight or the like can be used to reduce inclination and correct warp. Group III nitride composite substrate 1 may also be secured by means of suction. Group III nitride composite substrate 1 can uniformly be bonded to the polishing apparatus to reduce the thickness variation and the off-angle variation after polishing.

As seen from the above, regarding the method for manufacturing a group III nitride composite substrate in the present embodiment, it is preferable to polish the main surface of group III nitride film 13 in group III nitride composite substrate 1 obtained through cutting, in order to reduce the thickness variation and the off-angle variation of group III nitride film 13 in group III nitride composite substrate 1, keep the crystal quality high by eliminating a damaged layer caused by cutting of group III nitride film 13, and smooth the main surface.

Accordingly, regarding the method for manufacturing a group III nitride composite substrate in the present embodiment, the predetermined distance of the plane located inwardly from the bonded main surface of group III nitride film donor substrate 13D, for cutting group III nitride film donor substrate 13D in joined substrate 1L, 1LS along the plane at this distance, is preferably the sum determined by adding a polishing allowance, which is a portion to be removed away by polishing, to the thickness of group III nitride film 13 of group III nitride composite substrate 1 to be manufactured. Here, the polishing allowance is not particularly limited, but preferably 10 μm or more, more preferably 20 μm or more, and still more preferably 30 μm or more, in order to reduce the thickness variation and the off-angle variation and remove a damaged layer. Meanwhile, in order to reduce the material loss of group III nitride film donor substrate 13D, the polishing allowance is preferably 100 μm or less, more preferably 80 μm or less, and still more preferably 60 μm or less.

Referring also to FIGS. 6(D) and (B) and FIGS. 7(D) and (B), the remaining group III nitride film donor substrate 13Dr may have its main surface polished so that it can be used repeatedly.

<Use of Support-Incorporated Group III Nitride Film Donor Substrate>

Referring to FIG. 7(B) to (D), a support-incorporated group III nitride film donor substrate 5D in which a group III nitride film donor substrate support 15 is bonded to group III nitride film donor substrate 13D can be used to produce a group III nitride composite substrate 1 in a similar manner to the above. Support-incorporated group III nitride film donor substrate 5D has group III nitride film donor substrate support 15 which supports group III nitride film donor substrate 13D, and can therefore be used repeatedly even if group III nitride film donor substrate 13D becomes thinner to such an extent that substrate 13D cannot stand by itself.

Regarding support-incorporated group III nitride film donor substrate 5D, the form in which group III nitride film donor substrate support 15 and group III nitride film donor substrate 13D are bonded to each other is not particularly limited. In order to increase the joint strength of the bonding, however, it is preferable to dispose a joint film 14 therebetween. Group III nitride film donor substrate support 15 is also not particularly limited. In order to increase the support strength and prevent occurrence of crack and warp, however, it is preferable that support 15 is formed of a material having similar physical properties to support substrate 11. While joint film 14 is not particularly limited, it may preferably be any of $SiO_2$ film, $Si_3N_4$ film, $TiO_2$ film, $Ga_2O_3$ film, and the like, since these films provide a good joint to group III nitride film donor substrate support 15 and group III nitride film donor substrate 13D.

[Fifth Embodiment: Another Method for Manufacturing Group III Nitride Composite Substrate]

Figure 8:
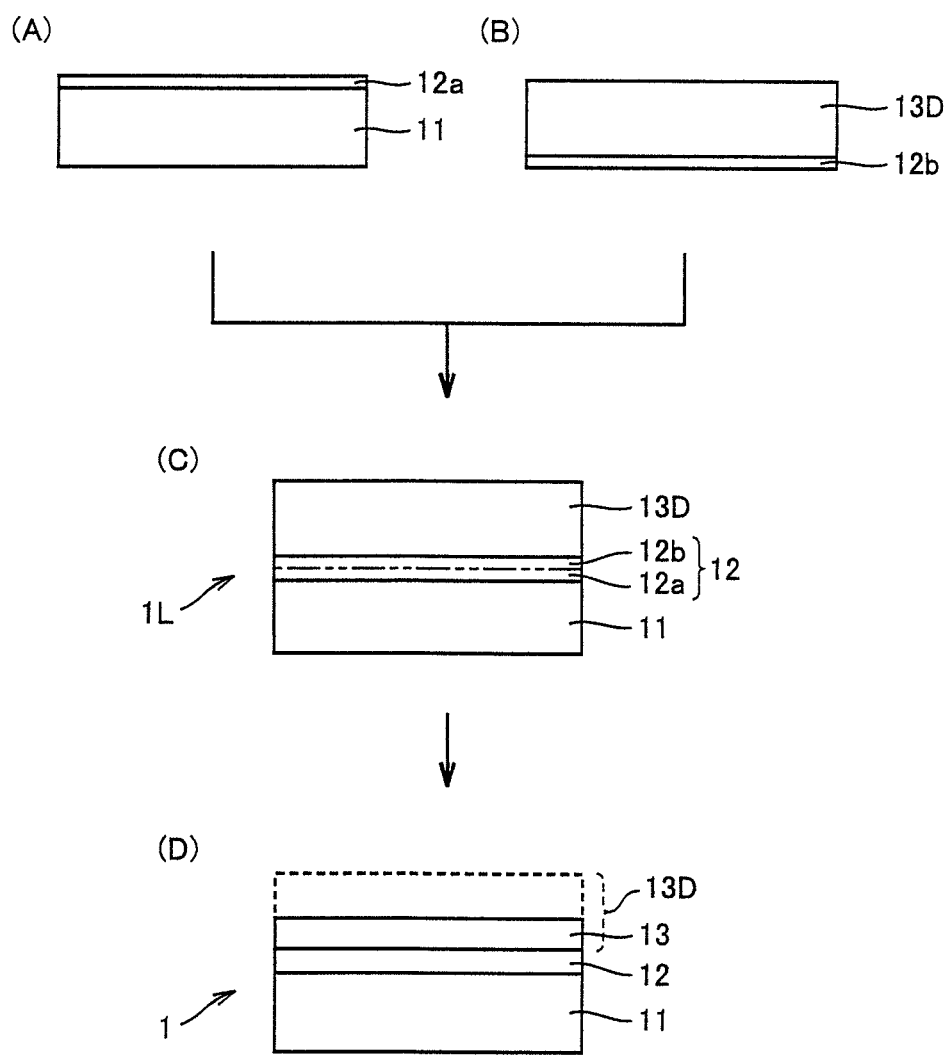
FIG. 8 is a schematic cross-sectional view showing still another example of the method for manufacturing a group III nitride composite substrate according to the present invention.

Referring to FIG. 8, a method for manufacturing a group III nitride composite substrate, which is a still further embodiment of the present invention, is specifically a method for manufacturing group III nitride composite substrate 1 of the first embodiment, including the steps of: forming joined substrate 1L having a diameter of 75 mm or more by bonding support substrate 11 and group III nitride film donor substrate 13D to each other (FIG. 8(A) to (C)); and forming group III nitride composite substrate 1 by performing at least one of grinding, polishing, and etching on a main surface of group III nitride film donor substrate 13D of joined substrate 1L, the main surface being located opposite to the bonded main surface of group III nitride film donor substrate 13D (FIG. 8(D)).

In accordance with the method for manufacturing a group III nitride composite substrate in the present embodiment, low-cost and large-diameter group III nitride composite substrate 1 including a group III nitride film having a large thickness and a high crystal quality can efficiently be manufactured.

Regarding the method for manufacturing group III nitride composite substrate 1 in the present embodiment, at least one of grinding, polishing, and etching is performed on the main surface opposite to the bonded main surface of group III nitride film donor substrate 13D to thereby adjust the film thickness by reducing it, and accordingly, group III nitride composite substrate 1 including group III nitride film 13 having a desired thickness of 10 μm or more and 250 μm less can be obtained.

According to the method for manufacturing group III nitride composite substrate 1 in the present embodiment, in the step of forming a group III nitride composite substrate, at least one of grinding, polishing, and etching is performed on the main surface opposite to the bonded main surface of the group III nitride film donor substrate. Therefore, in order to reduce the material loss of group III nitride film donor substrate 13D, the thickness of group III nitride film donor substrate 13D to be used is preferably 500 μm or less, and more preferably 400 μm or less.

<Step of Forming Joined Substrate>

Referring to FIG. 8(A) to (C), the step of forming joined substrate 1L includes, similarly to the method for manufacturing a group III nitride composite substrate in the fourth embodiment, the sub step of forming joint film 12a on the main surface of support substrate 11 (FIG. 8(A)), the sub step of forming joint film 12b on the main surface of group III nitride film donor substrate 13D (FIG. 8(B)), and the step of bonding joint film 12a formed on support substrate 11 and joint film 12b formed on group III nitride film donor substrate 13D to each other (FIG. 8(C)).

Here, the sub step of forming joint film 12a on the main surface of support substrate 11 as shown in FIG. 8(A) is similar to the sub step of forming joint film 12a on the main surface of support substrate 11 as shown in FIG. 6(A). The sub step of forming joint film 12b on the main surface of group III nitride film donor substrate 13D as shown in FIG. 8(B) is similar to the sub step of forming joint film 12b on the main surface of group III nitride film donor substrate 13D as shown in FIG. 6(B). The sub step of bonding joint film 12a formed on support substrate 11 and joint film 12b formed on group III nitride film donor substrate 13D to each other as shown in FIG. 8(C) is similar to the sub step of bonding joint film 12a formed on support substrate 11 and joint film 12b formed on group III nitride film donor substrate 13D to each other as shown in FIG. 6(C). Therefore, the description of them will not be repeated.

<Step of Forming Group III Nitride Composite Substrate>

Referring to FIG. 8(D), in the step of forming group III nitride composite substrate 1, at least one of grinding, polishing, and etching is performed on the main surface opposite to the bonded main surface of group III nitride film donor substrate 13D in joined substrate 1L, to thereby form group III nitride film 13 with its thickness reduced, from group III nitride film donor substrate 13D, and accordingly form group III nitride composite substrate 1 in which support substrate 11 and group III nitride film 13 are bonded together with joint film 12 interposed therebetween.

The method for grinding group III nitride film donor substrate 13D is not particularly limited, and may be grinding by means of one of a grinding wheel and abrasive grains. The method for polishing group III nitride film donor substrate 13D is not particularly limited, and may be rough polishing such as mechanical polishing, precision polishing such as CMP and chemical polishing, or the like. The method for etching group III nitride film donor substrate 13D is not particularly limited, and may be wet etching using a chemical solution, dry etching such as RIE (Reactive Ion Etching), or the like.

In order to reduce the thickness variation and the off-angle variation of group III nitride film 13 to be formed, it is preferable to polish the main surface of group III nitride film 13 of group III nitride composite substrate 1 obtained through at least one of grinding and etching. The reduction of the thickness by at least one of grinding, polishing, and etching is preferably 10 μm or more, more preferably 20 μm or more, and still more preferably 30 μm or more, in order to reduce the thickness variation and the off-angle variation, and remove a damaged layer. Meanwhile, the reduction of the thickness by at least one of grinding, polishing, and etching is preferably 100 μm or less, more preferably 80 μm or less, and still more preferably 60 μm or less, in order to reduce the material loss of group III nitride film donor substrate 13D.

[Sixth Embodiment: Method for Manufacturing Group III Nitride Semiconductor Device]

Figure 9:
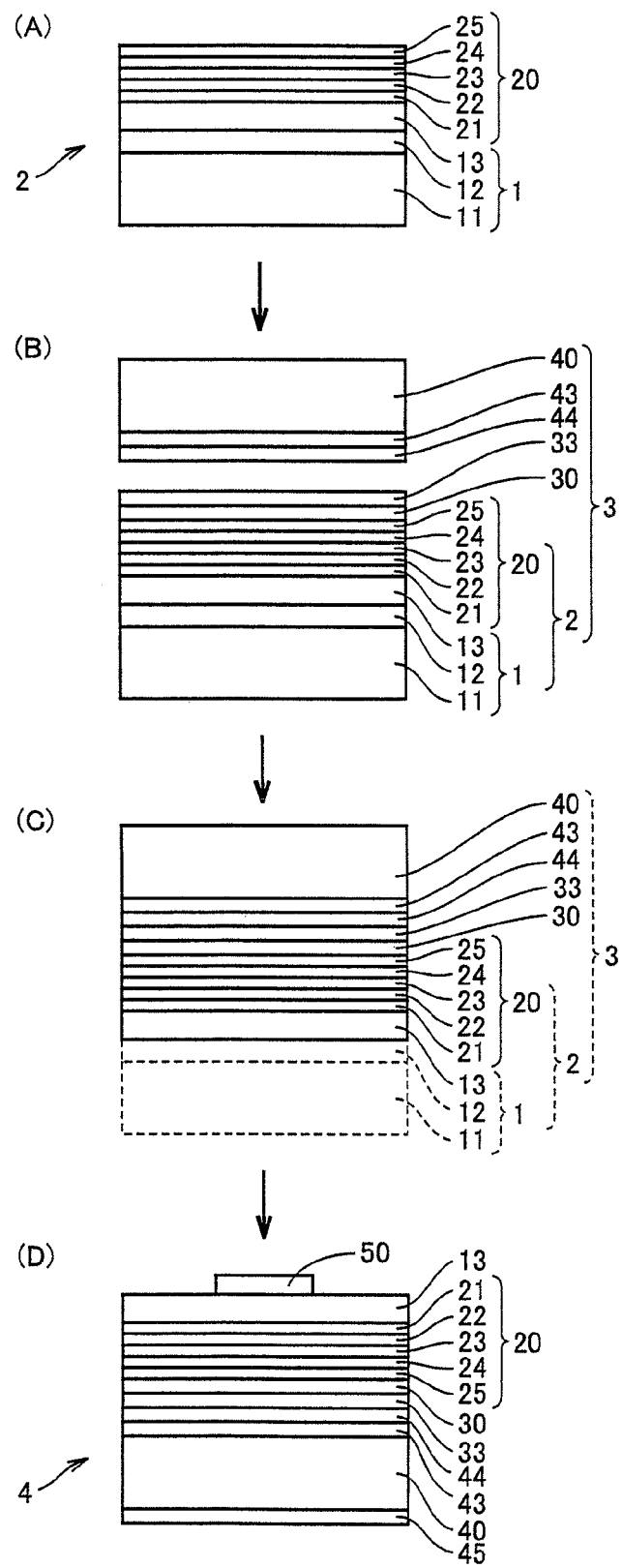
FIG. 9 is a schematic cross-sectional view showing an example of the method for manufacturing a group III nitride semiconductor device according to the present invention.

Referring to FIG. 9, a method for manufacturing a group III nitride semiconductor device, which is a still further embodiment of the present invention, includes the steps of: preparing group III nitride composite substrate 1 of the first embodiment; and growing at least one group III nitride layer 20 on group III nitride film 13 of group III nitride composite substrate 1 (FIG. 9(A)). The method for manufacturing a group III nitride semiconductor device in the present embodiment can be used to manufacture group III nitride semiconductor devices having excellent characteristics at a high yield.

The method for manufacturing a group III nitride semiconductor device in the present embodiment may further include the steps of: bonding a device support substrate 40 onto group III nitride layer 20 (FIG. 9(B)); and removing support substrate 11 from group III nitride composite substrate 1 (FIG. 9(C)). These steps can be added to manufacture, at a high yield, group III nitride semiconductor devices supported by device support substrate 40 and having a high mechanical strength and excellent characteristics.

The method for manufacturing a group III nitride semiconductor device may specifically be performed through the following steps.

<Step of Growing Group III Nitride Layer>

Referring to FIG. 9(A), in the step of growing at least one group III nitride layer 20 on group III nitride film 13 of group III nitride composite substrate 1, suitable methods for growing group III nitride layer 20 are gas phase methods such as MOVPE, MBE, HVPE, and sublimation method, as well as liquid phase methods such as flux method, in order to epitaxially grow group III nitride layer 20 having a high crystal quality, and a particularly suitable method is MOVPE.

The structure of group III nitride layer 20 varies depending on the type of group III nitride semiconductor device 4. In the case where group III nitride semiconductor device 4 is a light-emitting device, group III nitride layer 20 may be configured by successively growing, on group III nitride film 13, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25.

In this way, at least one group III nitride layer 20 is grown on group III nitride film 13 of group III nitride composite substrate 1, and accordingly laminated group III nitride composite substrate 2 is obtained.

<Step of Bonding Device Support Substrate>

Referring to FIG. 9(B), the step of bonding device support substrate 40 onto group III nitride layer 20 is performed by forming a first electrode 30 and a pad electrode 33 on group III nitride layer 20 of laminated group III nitride composite substrate 2, forming a pad electrode 43 and a joint metal film 44 on device support substrate 40, and bonding joint metal film 44 to pad electrode 33. Through these steps, laminated substrate 3 is obtained. As device support substrate 40, Si substrate, CuW substrate, or the like is used.

<Step of Removing Support Substrate>

Referring to FIG. 9(C), the step of removing support substrate 11 from group III nitride composite substrate 1 is performed by removing support substrate 11 of group III nitride composite substrate 1 from laminated substrate 3. In the case where group III nitride composite substrate 1 includes joint film 12 interposed between support substrate 11 and group III nitride film 13, joint film 12 can also be removed. The method for removing support substrate 11 and joint film 12 is not particularly limited, and suitable methods to be used are grinding, etching, and the like. For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (such as GaN), or the like, since the support substrate 11 of the polycrystalline material is easier to remove.

<Step of Forming Electrode>

Referring to FIG. 9(D), on group III nitride film 13 which has been exposed after removal of support substrate 11 and joint film 12 from laminated substrate 3, a second electrode 50 is formed and, on device support substrate 40, a device support substrate electrode 45 is formed.

EXAMPLES

Example A

1. Fabrication of Group III Nitride Composite Substrate

Referring to FIG. 6(A), a mullite substrate having a diameter of 75 mm was prepared for use as support substrate 11. Both surfaces of support substrate 11 were subjected to rough polishing by means of diamond abrasive grains and a copper-based surface plate, intermediate polishing by means of diamond abrasive grains and a tin surface plate, and finish polishing by means of a nonwoven polishing pad so that the surfaces were mirror-finished to have an RMS of 5 nm or less. After this, an SiO$_2$ film was grown to a thickness of 800 nm by the LP-CVD method on at least one of these surfaces. Then, CMP was performed using a slurry having a pH of 10 and containing colloidal silica abrasive grains having an average grain size of 40 nm, to thereby form joint film 12a having a thickness of 400 nm and planarized so that the RMS of the main surface was 0.3 nm or less. In order to remove abrasive grains used for CMP, non-abrasive polishing cleaning with a KOH aqueous solution and cleaning with pure water were performed.

Referring to FIG. 6(B), a GaN crystal body having a diameter of 75 mm and a thickness of 8 mm was prepared for use as group III nitride film donor substrate 13D. A surface-to-be-bonded of group III nitride film donor substrate 13D was subjected to mechanical polishing and CMP so that it was mirror-finished to have an RMS of 2 nm or less. After this, an SiO$_2$ film having a thickness of 800 nm was grown by the LP-CVD method on the surface-to-be-bonded, and CMP was performed using a slurry having a pH of 10 and containing colloidal silica abrasive grains having an average grain size of 40 nm, to thereby form joint film 12b having a thickness of 500 nm and having a main surface planarized to have an RMS of 0.3 nm or less. In order to remove abrasive grains used for CMP, non-abrasive polishing cleaning with a KOH aqueous solution and cleaning with pure water were performed. Here, group III nitride film donor substrate 13D was produced through growth by the HVPE method using a GaAs substrate as a support substrate.

Referring to FIG. 6(C), joint film 12a and joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Referring to FIG. 6(D), group III nitride film donor substrate 13D in joined substrate 1L was cut, with a wire saw, along a plane located inwardly at a depth of 180 μm from the bonded surface, namely the surface of group III nitride film donor substrate 13D bonded to joint film 12, to thereby produce group III nitride composite substrate 1 in which support substrate 11 and the GaN film which was group III nitride film 13 were bonded together with joint film 12 interposed therebetween. As the wire, a fixed-abrasive wire on which diamond abrasive grains were electrodeposited was used. As for the cutting method, in order to reduce the cut resistance and enhance the thickness precision and the flatness, the method was used that caused the wire to swing and caused group III nitride film donor substrate 13D to vibrate in synchronization therewith. The resistance coefficient for cutting with the wire saw was set to 4200 N. After cutting, group III nitride film 13 of group III nitride composite substrate 1 was subjected to mechanical polishing and CMP. After CMP, group III nitride film 13 had a thickness of 150 μm. In order to have a uniform thickness and a uniform off angle of group III nitride film 13, the composite substrate was mounted on a CMP apparatus in the following way. The shape of the substrate was corrected in advance by vacuum chuck suction, and thereafter the composite substrate was suction-fixed onto the apparatus.

Regarding group III nitride composite substrate 1 thus produced, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof are shown in Table 1. Here, mean value $m_t$ of the thickness, standard deviation $s_t$ of the thickness, mean value $m_o$ of the absolute value of the off angle, and standard deviation $s_o$ of the absolute value of the off angle, were calculated from the thickness and the absolute value of the off angle of group III nitride film 13 at the 13 measurement points P on the main surface of group III nitride film 13 as shown in FIG. 2, constituted of: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

2. Fabrication of Group III Nitride Semiconductor Device

Referring to FIG. 9(A), on group III nitride film 13 of group III nitride composite substrate 1, group III nitride layer 20 was formed by the MOVPE method. Specifically, on group III nitride film 13, n-GaN layer 21 having a thickness of 5 μm, n-$In_{0.05}Ga_{0.95}N$ layer 22 having a thickness of 50 nm, active layer 23 having a multiple quantum well structure of three cycles constituted of an $In_{0.14}Ga_{0.86}N$ well layer having a thickness of 3 nm and a GaN barrier layer having a thickness of 15 nm, p-$Al_{0.09}Ga_{0.91}N$ layer 24 having a thickness of 20 nm, and p-GaN layer 25 having a thickness of 150 nm were successively epitaxially grown to thereby produce laminated group III nitride composite substrate 2. After this, it was annealed by an RTA (Rapid Thermal Annealing) apparatus and accordingly activated.

Referring to FIG. 9(B), on p-GaN layer 25, which was the topmost layer in group III nitride layer 20 of laminated group III nitride composite substrate 2, an Ni layer having a thickness of 4 nm and an Au layer having a thickness of 200 nm were successively formed by the EB (Electron Beam) deposition method, and annealed into an alloy, to thereby form first electrode 30. On first electrode 30, a Ti layer having a thickness of 200 nm, a Pt layer having a thickness of 100 nm, and an Au layer having a thickness of 1000 nm were successively formed by the EB deposition method to thereby form pad electrode 33.

A CuW substrate was prepared for use as device support substrate 40. On device support substrate 40, a Ti layer having a thickness of 200 nm, a Pt layer having a thickness of 100 nm, and an Au layer having a thickness of 1000 nm were successively formed by the EB deposition method to thereby form pad electrode 43. On pad electrode 43, an AuSn solder film was formed as joint metal film 44.

Subsequently, joint metal film 44 was bonded to pad electrode 33 to thereby produce laminated substrate 3.

Referring to FIG. 9(C), from laminated substrate 3, support substrate 11 and joint film 12 in group III nitride composite substrate 1 were etched away by means of hydrofluoric acid.

Referring to FIG. 9(D), on group III nitride film 13 having been exposed by removal of support substrate 11 and joint film 12 from laminated substrate 3, a Ti layer having a thickness of 20 nm, an Al layer having a thickness of 200 nm, and an Au layer having a thickness of 300 nm were successively formed by the EB deposition method, and then annealed to form second electrode 50. On device support substrate 40, a Ti layer having a thickness of 20 nm and an Au layer having a thickness of 300 nm were successively formed by the EB deposition method, and annealed to thereby form device support substrate electrode 45. In this way, group III nitride semiconductor device 4 was obtained.

For group III nitride semiconductor device 4 thus obtained, its optical output was measured by means of an integrating sphere under the condition that injected current was 4 A. The optical output of the light-emitting device was measured in the following way. Specifically, into the light-emitting device mounted in the integrating sphere, predetermined current was injected, and the optical output was measured by a detector receiving the light collected from the light-emitting device. The resultant group III nitride semiconductor devices were classified into non-defective devices meeting a standard that the optical output was 2 W or more and defective devices failing to meet this standard, and the percentage of the ratio determined by dividing the non-defective devices by the sum of the non-defective devices and the defective devices was used as the yield. The yield of the group III nitride semiconductor devices is summarized in Table 1.

TABLE 1

|  | A1 | A2 | A3 | A4 | A5 | A6 | A7 | A8 | A9 |
|---|---|---|---|---|---|---|---|---|---|
| ratio $s_t/m_t$ | 0.001 | 0.002 | 0.01 | 0.05 | 0.1 | 0.15 | 0.2 | 0.25 | 0.2 |
| ratio $s_o/m_o$ | 0.005 | 0.008 | 0.05 | 0.2 | 0.4 | 0.5 | 0.6 | 0.6 | 0.7 |
| device yield (%) | 78 | 77 | 75 | 72 | 68 | 62 | 58 | 35 | 32 |

Referring to Table 1, group III nitride semiconductor devices manufactured at a high yield were those using a group III nitride composite substrate having a diameter of 75 mm and including a group III nitride film having a thickness of 150 μm, where the ratio $s_t/m_t$ of standard deviation $s_t$ of the thickness of the group III nitride film, to mean value $m_t$ of the thickness thereof was 0.001 or more and 0.2 or less, and the ratio $s_o/m_o$ of standard deviation $s_o$ of an absolute value of an off angle between the main surface of the group III nitride film and the (0001) plane, to mean value $m_o$ of the absolute value of the off angle thereof was 0.005 or more and 0.6 or less. It should be noted that, as to Example A1, sophisticated control was necessary for cutting and polishing in order to reduce the thickness variation and the off-angle variation, and thus the cutting and polishing took a long time.

Example B

Referring to FIGS. 6 and 8, group III nitride composite substrate 1 and group III nitride semiconductor device 4 were produced in a similar manner to Example A, except that a mullite-YSZ substrate (with respect to the whole substrate, mullite was 70% by mass and YSZ was 30% by mass and, with respect to YSZ, $ZrO_2$ was 90% by mole and $Y_2O_3$ was 10% by mole) was used as support substrate 11, and group III nitride composite substrates 1 having a diameter of 75 mm, a diameter of 100 mm, a diameter of 125 mm, and a diameter of 150 m, respectively, and having respective group III nitride films with different thicknesses as shown in Table 2 were produced.

Figure 10:
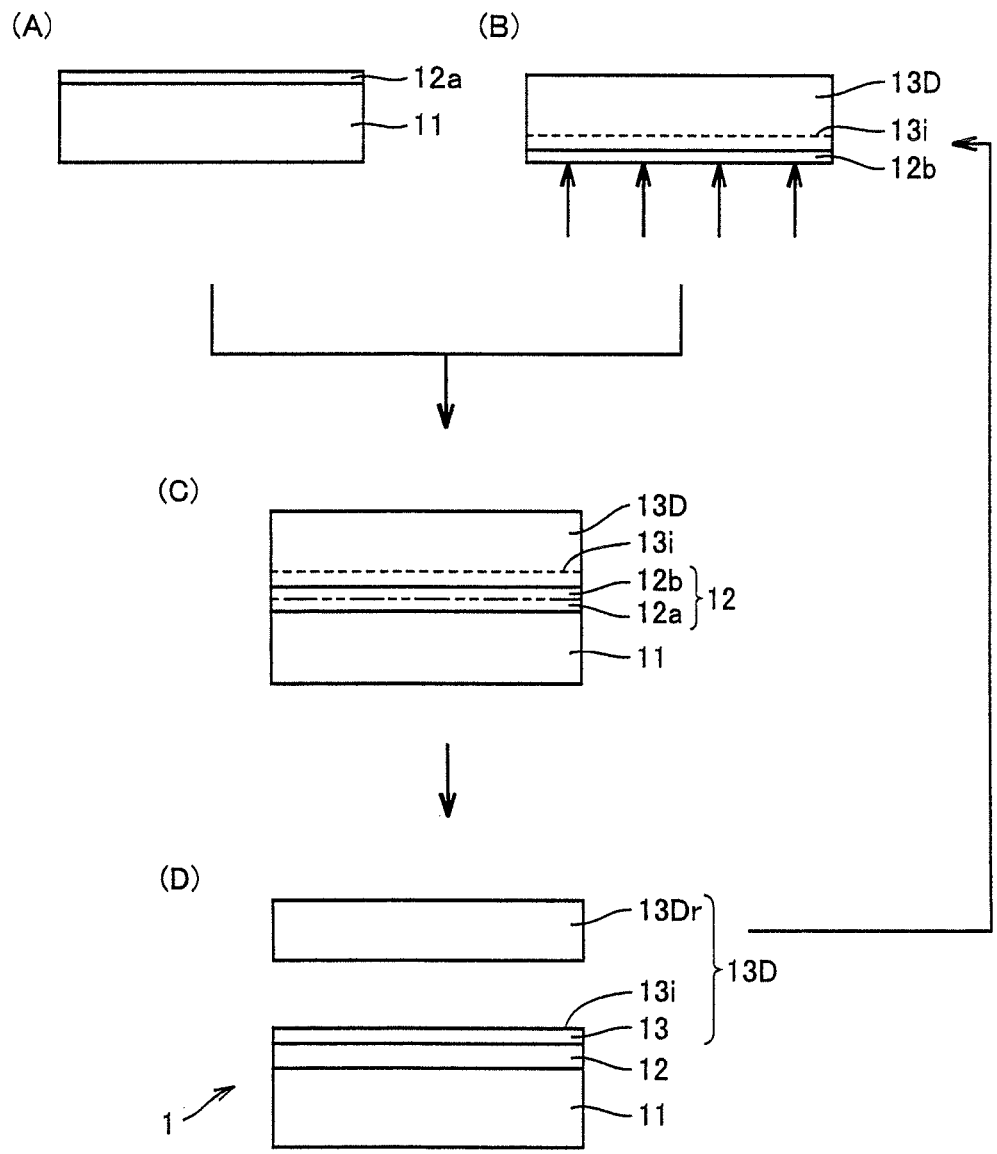
FIG. 10 is a schematic cross-sectional view showing an example of the method for manufacturing a group III nitride composite substrate through the use of ion implantation.

In a similar manner to Example A, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof were calculated for group III nitride composite substrate 1. The results are summarized in Table 2. The yield of group III nitride semiconductor devices 4 was also calculated in a similar manner to Example A. The results are summarized in Table 2.

film donor substrate 13D, to the position of a predetermined depth located inward from the main surface, to thereby form an ion implantation region 13i. After this, as shown in FIG. 10(C), support substrate 11 and the ion implantation region 13i side of group III nitride film donor substrate 13D were

TABLE 2

|  | B1 | B2 | B3 | B4 | B5 | B6 | B7 | B8 | B9 | B10 | B11 | B12 | B13 | B14 |
|---|---|---|---|---|---|---|---|---|---|---|---|---|---|---|
| diameter (mm) | 75 | 75 | 75 | 75 | 75 | 100 | 100 | 100 | 100 | 125 | 150 | 150 | 75 | 100 |
| thickness of group III nitride film (μm) | 10 | 30 | 100 | 170 | 200 | 10 | 110 | 170 | 200 | 110 | 120 | 160 | 250 | 250 |
| ratio $s_t/m_t$ | 0.12 | 0.12 | 0.12 | 0.12 | 0.12 | 0.12 | 0.12 | 0.12 | 0.12 | 0.12 | 0.12 | 0.12 | 0.12 | 0.12 |
| ratio $s_o/m_o$ | 0.3 | 0.3 | 0.3 | 0.3 | 0.3 | 0.3 | 0.3 | 0.3 | 0.3 | 0.3 | 0.3 | 0.3 | 0.3 | 0.3 |
| device yield (%) | 60 | 63 | 70 | 72 | 61 | 59 | 71 | 73 | 60 | 72 | 71 | 72 | 59 | 58 |

Referring to Table 2, group III nitride semiconductor devices manufactured at a high yield were those using a group III nitride composite substrate having a diameter of 75 mm to 150 mm and including a group III nitride film having a thickness of 10 μm to 250 μm, where the ratio $s_t/m_t$ of standard deviation $s_t$ of the thickness of the group III nitride film, to mean value $m_t$ of the thickness thereof was 0.12 falling within a range of 0.001 or more and 0.2 or less, and the ratio $s_o/m_o$ of standard deviation $s_o$ of an absolute value of an off angle between the main surface of the group III nitride film and the (0001) plane, to mean value $m_o$ of the absolute value of the off angle thereof was 0.3 falling within a range of 0.005 or more and 0.6 or less.

Example C

As substrates for semiconductor devices, a group III nitride free-standing substrate (hereinafter also referred to as FS substrate), a group III nitride composite substrate (hereinafter also referred to as BP substrate) produced by the ion implantation method, and a group III nitride composite substrate (hereinafter also referred to as BS substrate) produced in accordance with the fourth embodiment of the present invention were prepared.

The FS substrate was prepared to have the diameter and the thickness shown in Table 3, by cutting a GaN crystal body having a predetermined diameter with a wire saw and polishing it.

The BP substrate was prepared to have the diameter and the thickness of its group III nitride film shown in Table 3. Specifically, as shown in FIG. 10(B), hydrogen ions were implanted from the main surface of the GaN crystal body having a predetermined diameter, namely group III nitride bonded together with joint film 12 interposed therebetween. After this, as shown in FIG. 10(D), annealing was done at 850° C. to separate group III nitride film donor substrate 13D along its ion implantation region 13i. Here, a mullite substrate was used as support substrate 11.

The BS substrate was prepared to have the diameter and the thickness of its group III nitride film as shown in Table 3, in a similar manner to Example B except that a mullite substrate was used as the support substrate.

Group III nitride composite substrates 1 and group III nitride semiconductor devices 4 were fabricated in a similar manner to Example B, except that the above-described FS substrate, BP substrate, and BS substrate were used.

In a similar manner to Example A, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof were calculated for group III nitride composite substrate 1. The results are summarized in Table 3. The yield of group III nitride semiconductor devices 4 was also calculated in a similar manner to Example A. The results are summarized in Table 3.

TABLE 3

|  | FS substrate | | | | | | | BP substrate | | | BS substrate | | | |
|---|---|---|---|---|---|---|---|---|---|---|---|---|---|---|
|  | C1 | C2 | C3 | C4 | C5 | C6 | C7 | C8 | C9 | C10 | C11 | C12 | C13 | C14 |
| diameter (mm) | 50 | 75 | 75 | 100 | 100 | 100 | 125 | 75 | 100 | 125 | 75 | 100 | 125 | 150 |
| thickness of group III nitride film (μm) | 250 | 200 | 400 | 250 | 450 | 450 | 500 | 0.5 | 0.5 | 0.5 | 150 | 150 | 150 | 150 |
| warp (μm) | 50 | 140 | 40 | 180 | 30 | 30 | 35 | 25 | 30 | 35 | 30 | 30 | 30 | 30 |
| ratio $s_t/m_t$ | 0.16 | 0.16 | 0.16 | 0.16 | 0.16 | 0.25 | 0.16 | 0.16 | 0.16 | 0.16 | 0.16 | 0.16 | 0.16 | 0.16 |
| ratio $s_o/m_o$ | 0.42 | 0.42 | 0.42 | 0.42 | 0.42 | 0.65 | 0.42 | 0.42 | 0.42 | 0.42 | 0.42 | 0.42 | 0.42 | 0.42 |
| device yield (%) | 54 | crack | 55 | crack | 58 | 19 | 57 | 0 | 0 | 0 | 66 | 65 | 67 | 68 |

Referring to Table 3, as to the group III nitride semiconductor devices fabricated using FS substrates having a diameter of 50 mm to 125 mm and a thickness of 200 μm to 500 μm, those having a relatively large diameter and a relatively small thickness had a large warp and were likely to crack, and the yields of them were all less than 60%.

As to the group III nitride semiconductor devices fabricated using BP substrates having a diameter of 75 mm to 125 mm and a thickness of the group III nitride film of 0.5 µm, they did not exhibit excellent device characteristics due to the relatively small thickness of the group III nitride film, resulting in lower yields.

In contrast, the yields of the group III nitride semiconductor devices produced using BS substrates were higher, namely 65% or more.

Example D

A plurality of group III nitride composite substrates were fabricated in a similar manner to Example B, except that an $Al_2O_3$—$SiO_2$ composite oxide substrate (with respect to the whole substrate, $Al_2O_3$ was 85% by mass and $SiO_2$ was 15% by mass) was used as the support substrate. The warp and the TTV of the substrates were measured. The results are shown in Table 4. Here, the warp and the TTV of the group III nitride composite substrates were measured by means of an interferometric flatness tester.

These group III nitride composite substrates were used to fabricate group III nitride semiconductor devices in a similar manner to Example B.

For the group III nitride composite substrates, the ratio $s_t/m_t$ of standard deviation $s_t$ of the thickness of the group III nitride film, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof, as well as the warp and the TTV of the group III nitride composite substrates are shown in Table 4. The yield of group III nitride semiconductor devices 4 was also calculated in a similar manner to Example A. The results are summarized in Table 4.

surface on the group III nitride film side of 50 µm or less and having a TTV of 30 µm or less.

Example E

Group III nitride semiconductor devices were fabricated in a similar manner to Example B, except that different types of group III nitride composite substrates were used that were different in ratio $\alpha_{III-N}/\alpha_S$ of thermal expansion coefficient $\alpha_{III-N}$ of the group III nitride film to thermal expansion coefficient $\alpha_s$ of the support substrate, and ratio $t_{III-N}/t_S$ of thickness $t_{III-N}$ of the group III nitride film to thickness $t_s$ of the support substrate. Here, in order to vary these ratios, mullite substrate, mullite-YSZ substrate, and $Al_2O_3$—$SiO_2$ composite oxide substrate were used as the support substrates.

The ratio $\alpha_{III-N}/\alpha_S$ of thermal expansion coefficient $\alpha_{III-N}$ of the group III nitride film to thermal expansion coefficient $\alpha_s$ of the support substrate, the ratio $t_{III-N}/t_S$ of thickness $t_{III-N}$ of the group III nitride film to thickness $t_s$ of the support substrate, and the yield of the group III nitride semiconductor devices are shown in Table 5.

TABLE 5

|  | E1 | E2 | E3 | E4 | E5 | E6 | E7 | E8 | E9 | E10 | E11 |
|---|---|---|---|---|---|---|---|---|---|---|---|
| diameter (mm) | 75 | 75 | 75 | 75 | 75 | 100 | 100 | 100 | 100 | 150 | 150 |
| type of support substrate | mullite | mullite | mullite | mullite | mullite | mullite | mullite-YSZ | $Al_2O_3$—$SiO_2$ | $Al_2O_3$—$SiO_2$ | mullite | mullite-YSZ |
| ratio $\alpha_{III-N}/\alpha_S$ | 1.2 | 1.2 | 1.2 | 1.2 | 1.2 | 1.2 | 1 | 1.25 | 0.75 | 1.2 | 1 |
| ratio $t_{III-N}/t_S$ | 0.02 | 0.1 | 0.25 | 0.6 | 1 | 0.3 | 0.3 | 0.3 | 0.3 | 0.2 | 0.2 |
| device yield (%) | 62 | 65 | 70 | 66 | 64 | 71 | 75 | 65 | 62 | 68 | 72 |

Referring to Table 5, the group III nitride semiconductor devices manufactured at a high yield were those using group III nitride composite substrates having a ratio $\alpha_{III-N}/\alpha_S$ of thermal expansion coefficient $\alpha_{III-N}$ of the group III nitride film to thermal expansion coefficient $\alpha_s$ of the support substrate of 0.75 or more and 1.25 or less, and a ratio $t_{III-N}/t_S$ of thickness $t_{III-N}$ of the group III nitride film to thickness $t_s$ of the support substrate of 0.02 or more and 1 or less.

Example F

Group III nitride composite substrates and group III nitride semiconductor devices were produced in a similar manner to Example B, except that the cleaning conditions were tailored to adjust the amount of impurity metal atoms of the surface of

TABLE 4

|  | D1 | D2 | D3 | D4 | D5 | D6 | D7 | D8 | D9 | D10 | D11 | D12 | D13 |
|---|---|---|---|---|---|---|---|---|---|---|---|---|---|
| diameter (mm) | 100 | 100 | 100 | 100 | 100 | 100 | 100 | 100 | 75 | 150 | 150 | 150 | 150 |
| thickness of group III nitride film (µm) | 110 | 110 | 110 | 110 | 110 | 110 | 110 | 110 | 130 | 120 | 120 | 120 | 120 |
| warp (µm) | 15 | 30 | 50 | 70 | 30 | 30 | 50 | 50 | 50 | 50 | 50 | 50 | 90 |
| TTV (µm) | 15 | 15 | 20 | 40 | 10 | 20 | 30 | 50 | 30 | 30 | 60 | 30 | 30 |
| ratio $s_t/m_t$ | 0.08 | 0.08 | 0.08 | 0.08 | 0.08 | 0.08 | 0.08 | 0.08 | 0.08 | 0.08 | 0.08 | 0.08 | 0.08 |
| ratio $s_o/m_o$ | 0.36 | 0.36 | 0.36 | 0.36 | 0.36 | 0.36 | 0.36 | 0.36 | 0.36 | 0.36 | 0.36 | 0.36 | 0.36 |
| device yield (%) | 75 | 68 | 63 | 55 | 74 | 67 | 60 | 57 | 61 | 61 | 58 | 60 | 57 |

Referring to Table 4, the group III nitride semiconductor devices manufactured at a high yield were those using group III nitride composite substrates having a warp of the main the group III nitride film. The diameter of the group III nitride composite substrate, the amount of impurity metal atoms of the surface of the group III nitride film, and the yield of the group III nitride semiconductor devices are shown in Table 6. Here, the amount of impurity metal atoms of the surface of the group III nitride film was measured by the TXRF (Total Reflection X-ray Fluorescence) method. Here, the measurements by the TXRF method were done by means of a tungsten (W) x-ray source under a condition that the angle of incidence was 0.05°.

TABLE 6

|  | F1 | F2 | F3 | F4 | F5 | F6 | F7 |
|---|---|---|---|---|---|---|---|
| diameter | 75 | 75 | 75 | 75 | 100 | 100 | 150 |
| impurity metal atoms ($\times 10^{10}$ atoms/cm$^2$) | 6 | 40 | 300 | 500 | 8 | 80 | 10 |
| device yield (%) | 70 | 68 | 63 | 58 | 69 | 65 | 69 |

Referring to Table 6, group III nitride semiconductor devices manufactured at a high yield were those using group III nitride composite substrates having impurity metal atoms of the main surface of the group III nitride film of $3 \times 10^{12}$ atoms/cm$^2$ or less.

Example G

Group III nitride composite substrates and group III nitride semiconductor devices were fabricated in a similar manner to Example B, except that a mullite substrate was used as the support substrate and, as the group III nitride film donor substrate, a uniform GaN crystal body without dislocation concentrated region that had O and Si added as dopants and had a dislocation density of $4 \times 10^6$ cm$^{-2}$ and a carrier concentration of $2 \times 10^{18}$ cm$^{-3}$ was used. Here, the polishing conditions were tailored to adjust the maximum RMS of respective main surfaces of the group III nitride film and the support substrate.

As to the group III nitride composite substrates, the maximum RMS of the main surface of the group III nitride film and the maximum RMS of the main surface of the support substrate, as well as the yield of the group III nitride semiconductor devices are shown in Table 7.

TABLE 7

|  | G1 | G2 | G3 | G4 | G5 | G6 | G7 | G8 | G9 |
|---|---|---|---|---|---|---|---|---|---|
| maximum RMS of main surface of group III nitride film (nm) | 0.5 | 1 | 3 | 5 | 1 | 1 | 1 | 1 | 3 |
| maximum RMS of main surface of support substrate (nm) | 1 | 1 | 1 | 1 | 2 | 6 | 12 | 18 | 12 |
| device yield (%) | 68 | 64 | 58 | 52 | 65 | 63 | 57 | 53 | 55 |

Referring to Table 7, group III nitride semiconductor devices manufactured at a high yield were those using group III nitride composite substrates having an RMS of the main surface of the group III nitride film of 3 nm or less and an RMS of the main surface of the support substrate of 12 nm or less.

Example H

Group III nitride composite substrates were fabricated in a similar manner to Example B, except that an $Al_2O_3$—$SiO_2$ composite oxide substrate (with respect to the whole substrate, $Al_2O_3$ was 82% by mass and $SiO_2$ was 18% by mass) was used as the support substrate and, as the group III nitride film donor substrate, a semi-insulating GaN crystal body having Fe added as a dopant and a specific resistance of $1 \times 10^7$ Ωcm was used. Here, the polishing conditions were tailored to adjust mean value $m_{III\text{-}N}$ and standard deviation $s_{III\text{-}N}$ of the RMS of the main surface of the group III nitride film in the group III nitride composite substrate as well as mean value $m_S$ and standard deviation $s_S$ of the RMS of the main surface of the support substrate.

Further, referring to FIG. 5, an HEMT was fabricated as group III nitride semiconductor device 4 in the following manner.

On group III nitride film 13 of group III nitride composite substrate 1, GaN layer 26 having a thickness of 1.5 μm and $Al_{0.2}Ga_{0.8}N$ layer 27 having a thickness of 30 nm were successively epitaxially grown by the MOVPE method to form group III nitride layer 20, to thereby produce laminated group III nitride composite substrate 2.

Next, on $Al_{0.2}Ga_{0.8}N$ layer 27, a source electrode 60 and a drain electrode 70 were fabricated by photolithography, EB deposition, and lift-off. In these electrodes, a Ti layer having a thickness of 20 nm, an Al layer having a thickness of 100 nm, a Ti layer having a thickness of 20 nm, and an Au layer having a thickness of 300 nm were successively formed, lifted off, and annealed for 1 minute at 600° C. into an alloy.

Next, in a similar step to the step of fabricating source electrode 60 and drain electrode 70, a gate electrode 80 was fabricated. For fabrication of gate electrode 80, an Ni layer having a thickness of 50 nm and an Au layer having a thickness of 500 nm were successively formed. The gate length was set to 2 μm.

In the HEMT which was group III nitride semiconductor device 4 obtained in this way, GaN layer 26 and $Al_{0.2}Ga_{0.8}N$ layer 27 were formed as at least one group III nitride layer 20 on group III nitride film 13 of group III nitride composite substrate 1, and source electrode 60, drain electrode 70, and gate electrode 80 were disposed on $Al_{0.2}Ga_{0.8}N$ layer 27 so that the electrodes were separated from each other and gate electrode 80 was located between source electrode 60 and drain electrode 70.

The leakage gate current density of the obtained HEMT was inspected. Specifically, the produced devices were classified into non-defective devices meeting a standard that the leakage gate current density was $1 \times 10^{-6}$ A/cm$^2$ or less when being applied with a gate voltage of 5 V, and defective devices failing to meet this standard, and the percentage of the ratio determined by dividing the non-defective devices by the sum of the non-defective and defective devices was used as a yield.

Mean value $m_{III\text{-}N}$ and standard deviation $s_{III\text{-}N}$ of the RMS of the main surface of the group III nitride film in the group III nitride composite substrate, mean value $m_S$ and standard deviation $s_S$ of the RMS of the main surface of the support substrate, and the yield of group III nitride semiconductor devices are shown in Table 8.

TABLE 8

| | H1 | H2 | H3 | H4 | H5 | H6 | H7 | H8 | H9 | H10 | H11 | H12 |
|---|---|---|---|---|---|---|---|---|---|---|---|---|
| mean value $m_{III-N}$ of RMS of main surface of group III nitride film (nm) | 0.1 | 0.5 | 1 | 2 | 3 | 2 | 2 | 2 | 2 | 2 | 2 | 2 |
| standard deviation $s_{III-N}$ of RMS of main surface of group III nitride film (nm) | 0.03 | 0.1 | 0.2 | 0.4 | 0.4 | 0.5 | 0.4 | 0.4 | 0.4 | 0.4 | 0.4 | 0.4 |
| mean value ms of RMS of main surface of support substrate (nm) | 2 | 2 | 2 | 2 | 2 | 2 | 0.3 | 2 | 5 | 10 | 13 | 10 |
| standard deviation $s_S$ of RMS of main surface of support substrate (nm) | 0.2 | 0.2 | 0.2 | 0.2 | 0.2 | 0.2 | 0.1 | 0.4 | 1.4 | 3 | 3 | 4 |
| device yield (%) | 72 | 69 | 65 | 60 | 51 | 52 | 68 | 67 | 64 | 57 | 51 | 52 |

Referring to Table 8, group III nitride semiconductor devices manufactured at a high yield were those using a group III nitride composite substrate in which the main surface of the group III nitride film had a mean value $m_{III-N}$ of the RMS of 0.1 nm or more and 2 nm or less and a standard deviation $s_{III-N}$ of the RMS of 0.4 nm or less, and the main surface of the support substrate had a mean value $m_S$ of the RMS of 0.3 nm or more and 10 nm or less and a standard deviation $s_S$ of the RMS of 3 nm or less.

Example I

1. Fabrication of Group III Nitride Composite Substrate

Referring to FIG. 8(A) to (C), joined substrate 1L was produced in a similar manner to Example A, except that: an $Al_2O_3$—$SiO_2$ composite oxide substrate (with respect to the whole substrate, $Al_2O_3$ was 88% by mass and $SiO_2$ was 12% by mass) having a diameter of 100 mm was prepared for use as support substrate 11; a GaN crystal substrate having a diameter of 100 mm and a thickness of 400 μm was prepared for use as group III nitride film donor substrate 13D; on respective main surfaces of support substrate 11 and group III nitride film donor substrate 13D, an $SiO_2$ film was grown to a thickness of 500 nm by the PE-CVD method, and thereafter CMP was performed using a slurry having a pH of 9 and containing colloidal silica having an average grain size of 20 nm, to thereby form joint films 12a, 12b having a thickness of 250 nm and having a main surface planarized to have an RMS roughness of 0.15 nm or less; and scrub cleaning was performed with pure water and a sponge made of PVA (polyvinyl alcohol), as the cleaning with pure water.

Referring to FIG. 8(D), grinding and polishing were performed on the main surface of group III nitride film donor substrate 13D in joined substrate 1L that was opposite to the bonded main surface thereof For grinding, a vitrified grinding wheel containing diamond abrasive grains having an average grain size of 25 μm to 35 μm was used. For polishing, mechanical polishing was performed in a stepwise manner using slurries containing diamond abrasive grains having an average grain size of 3 μm, 2 μm, and 0.25 μm, respectively. This polishing was performed, in order to reduce the thickness variation and the off-angle variation, in such a manner that the warp of the substrate was corrected in advance by mechanical pressurization and the substrate in this state was bonded to a holding plate. After polishing, dry etching was performed by means of chlorine gas plasma which was generated by the ICP-RIE (Inductively Coupled Plasma Reactive Ion Etching) method. It should be noted, Example I8 used, instead of the above-described grinding, rough polishing performed by means of diamond abrasive grains having an average grain size of 9 μm. In this way, group III nitride composite substrate 1 including group III nitride film 13 having a thickness of 150 μm was obtained.

2. Fabrication of Group III Nitride Semiconductor Device

Referring to FIG. 9, group III nitride semiconductor device 4 was produced in a similar manner to Example A, except that: group III nitride composite substrate 1 of the present Example was used; support substrate 11 and joint film 12 were removed from laminated substrate 3 by grinding with a vitrified grinding wheel containing diamond abrasive grains having an average grain size of 35 μm to 45 μm, except that, for Example I9, they were removed by polishing with diamond abrasive grains having an average grain size of 15 μm; in order to remove residue of the joint film and the support substrate after the grinding and/or the polishing, etching cleaning was performed with hydrofluoric acid.

In a similar manner to Example A, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof were calculated for group III nitride composite substrate 1. The results are summarized in Table 9. The yield of group III nitride semiconductor devices 4 was also calculated in a similar manner to Example A. The results are summarized in Table 9.

TABLE 9

| | I1 | I2 | I3 | I4 | I5 | I6 | I7 | I8 | I9 |
|---|---|---|---|---|---|---|---|---|---|
| ratio $s_t/m_t$ | 0.001 | 0.002 | 0.05 | 0.15 | 0.2 | 0.25 | 0.2 | 0.05 | 0.05 |
| ratio $s_o/m_o$ | 0.005 | 0.008 | 0.2 | 0.5 | 0.6 | 0.6 | 0.7 | 0.2 | 0.2 |
| device yield (%) | 76 | 76 | 72 | 61 | 56 | 34 | 31 | 71 | 73 |

Referring to Table 9, group III nitride semiconductor devices manufactured at a high yield were those using a group III nitride composite substrate including a group III nitride film where the ratio $s_t/m_t$ of standard deviation $s_t$ of the thickness of the group III nitride film, to mean value $m_t$ of the thickness thereof was 0.001 or more and 0.2 or less, and the ratio $s_o/m_o$ of standard deviation $s_o$ of an absolute value of an off angle between the main surface of the group III nitride film and the (0001) plane, to mean value $m_o$ of the absolute value of the off angle thereof was 0.005 or more and 0.6 or less. It should be noted that, as to Example I1, sophisticated control was necessary for the grinding and polishing in order to reduce the thickness variation and the off-angle variation, and thus the grinding and polishing took a long time.

Example J

1. Fabrication of Group III Nitride Composite Substrate

Referring to FIG. 6(A), an $Al_2O_3$—$SiO_2$ composite oxide substrate (with respect to the whole substrate, $Al_2O_3$ was 78% by mass and $SiO_2$ was 22% by mass) having a diameter of 100 mm and a thickness of 500 μm was prepared for use as support substrate 11. Both surfaces of support substrate 11 were subjected to rough polishing by means of diamond abrasive grains and a copper-based surface plate, an intermediate polishing by means of diamond abrasive grains and a tin surface plate, and finish polishing by means of a nonwoven polishing pad so that the surfaces were mirror-finished to have an RMS of 5 nm or less. After this, an $SiO_2$ film was grown to a thickness of 1000 nm by the AP-CVD (Atmospheric Pressure-Chemical Vapor Deposition) method on at least one of these surfaces. Then, CMP was performed with a slurry having a pH of 10 and containing fumed silica abrasive grains having an average grain size of 100 nm, and CMP was performed with a slurry having a pH of 9 and containing colloidal silica abrasive grains having an average grain size of 30 nm, to thereby form joint film 12a having a thickness of 250 nm and planarized so that the RMS of the main surface was 0.15 nm or less. In order to remove abrasive grains used for CMP, scrub cleaning by means of an aqueous solution of ammonium and a PVA sponge and cleaning with pure water were performed.

Referring to FIG. 6(B), a GaN crystal body having a diameter of 100 mm and a thickness of 7 mm was prepared for use as group III nitride film donor substrate 13D. A surface-to-be-bonded of group III nitride film donor substrate 13D was subjected to mechanical polishing and CMP so that it was mirror-finished to have an RMS of 2 nm or less. After this, an $SiO_2$ film was grown to a thickness of 1000 nm by the AP-CVD method on the surface-to-be-bonded. Then, CMP was performed using a slurry having a pH of 10 and containing fumed silica abrasive grains having an average grain size of 100 nm, and CMP was performed using a slurry having a pH of 9 and containing colloidal silica abrasive grains having an average grain size of 30 nm, to thereby form joint film 12b having a thickness of 250 nm and having a main surface planarized to have an RMS of 0.15 rim or less. In order to remove abrasive grains used for CMP, scrub cleaning by means of an aqueous solution of ammonium and a PVA sponge and cleaning with pure water were performed. Here, group III nitride film donor substrate 13D was a GaN crystal body grown by the HVPE method using a GaAs substrate as a base substrate. This GaN crystal body, namely group III nitride film donor substrate 13D, had been doped with O and Si and had a resistivity of $5 \times 10^{-3}$ Ωcm.

Referring to FIG. 6(C), joint film 12a and joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Referring to FIG. 6(D), group III nitride film donor substrate 13D in joined substrate 1L was cut, by electrical discharge processing using a wire electrode, along a plane located inwardly at a depth of 150 μm from the bonded surface, namely the surface of group III nitride film donor substrate 13D bonded to joint film 12, to thereby produce group III nitride composite substrate 1 in which support substrate 11 and the GaN film which was group III nitride film 13 were bonded together with joint film 12 interposed therebetween. For the wire electrode, a wire having a diameter of 100 μm was used. As to the wire, a brass-coated piano wire (core: piano wire, coating: brass (mass ratio Cu:Zn=70:30)) was used for Examples J1 to J7, a brass-and-zinc-coated piano wire (core: piano wire, inner coating: brass (mass ratio Cu:Zn=70:30), outer coating: zinc) was used for Example J8, and a tungsten wire was used for Example J9.

In order to suppress occurrence of warp due to processing damage after cutting, and to make the thickness of the group III nitride film and the off angle thereof uniform, joined substrate 1L was mounted, before cutting, on a processing holder in such a manner that support substrate 11 was attached to the holder. After cutting, the main surface of group III nitride film 13 of group III nitride composite substrate 1 was subjected to grinding, mechanical polishing, and dry etching in the following manner to be thereby smoothed. First, grinding was performed using a vitrified grinding wheel containing diamond abrasive grains having an average grain size of 25 μm to 35 μm and a vitrified grinding wheel containing diamond abrasive having an average grain size of 5 μm. Next, mechanical polishing was performed using a slurry containing diamond abrasive grains having an average grain size of 2 μm and a slurry containing diamond abrasive grains having an average grain size of 0.5 μm, where the slurries were used in the above-referenced order. Next, dry etching was performed using chlorine gas plasma by means of an ICP-RIE apparatus. After ICP-RIE, the group III nitride film had a thickness of 110 μm.

Regarding group III nitride composite substrate 1 thus obtained, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof have been calculated and are shown in Table 10.

2. Fabrication of Group III Nitride Semiconductor Device

Referring to FIG. 9, group III nitride semiconductor device 4 was fabricated in a similar manner to Example A, except that, for removing support substrate 11 and joint film 12 from laminated substrate 3 as shown in FIG. 9(C), grinding was performed to reduce the thickness of support substrate 11 from 500 μm to 100 μm before etching of support substrate 11 and joint film 12 by means of hydrofluoric acid. Specifically, support substrate 11 was subjected to grinding using a vitrified grinding wheel containing diamond abrasive grains having an average grain size of 35 μm to 45 μm. As to group III nitride semiconductor devices 4 thus obtained, the yield was calculated in a similar manner to Example A, and the results are summarized in Table 10.

TABLE 10

|  | J1 | J2 | J3 | J4 | J5 | J6 | J7 | J8 | J9 |
|---|---|---|---|---|---|---|---|---|---|
| ratio $s_t/m_t$ | 0.001 | 0.002 | 0.01 | 0.15 | 0.2 | 0.25 | 0.2 | 0.05 | 0.05 |
| ratio $s_o/m_o$ | 0.005 | 0.008 | 0.05 | 0.5 | 0.6 | 0.6 | 0.7 | 0.2 | 0.2 |
| device yield (%) | 79 | 77 | 75 | 63 | 57 | 37 | 34 | 74 | 73 |

Referring to Table 10, group III nitride semiconductor devices manufactured at a high yield were those fabricated using a group III nitride composite substrate having a diameter of 100 mm and including a group III nitride film having a thickness of 110 μm, where the ratio $s_t/m_t$ of standard deviation $s_t$ of the thickness of the group III nitride film, to mean value $m_t$ of the thickness thereof was 0.001 or more and 0.2 or less, and the ratio $s_o/m_o$ of standard deviation $s_o$ of an absolute value of an off angle between the main surface of the group III nitride film and the (0001) plane, to mean value $m_o$ of the absolute value of the off angle thereof was 0.005 or more and 0.6 or less. It should be noted that, as to Example J1, sophisticated control was necessary for cutting and polishing in order to reduce the thickness variation and the off-angle variation, and thus the cutting and polishing took a long time.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A group III nitride composite substrate with a diameter of 75 mm or more including a support substrate and a group III nitride film having a thickness of 10 μm or more and 250 μm or less that are bonded to each other,
a ratio $s_t/m_t$ of a standard deviation $s_t$ of the thickness of said group III nitride film, to a mean value $m_t$ of the thickness thereof being 0.001 or more and 0.2 or less, and a ratio $s_o/m_o$ of a standard deviation $s_o$ of an absolute value of an off angle between a main surface of said group III nitride film and a plane of a predetermined plane orientation of said group III nitride film, to a mean value $m_o$ of the absolute value of the off angle thereof being 0.005 or more and 0.6 or less.

2. A group III nitride composite substrate with a diameter of 75 mm or more including a support substrate and a group III nitride film having a thickness of 10 μm or more and 200 μm or less that are bonded to each other,
a ratio $s_t/m_t$ of a standard deviation $s_t$ of the thickness of said group III nitride film, to a mean value $m_t$ of the thickness thereof being 0.001 or more and 0.2 or less, and a ratio $s_o/m_o$ of a standard deviation $s_o$ of an absolute value of an off angle between a main surface of said group III nitride film and a plane of a predetermined plane orientation of said group III nitride film, to a mean value $m_o$ of the absolute value of the off angle thereof being 0.005 or more and 0.6 or less.

3. The group III nitride composite substrate according to claim 1, wherein said group III nitride composite substrate has a warp of 50 μm or less on the main surface of said group III nitride film, and said group III nitride composite substrate has a total thickness variation of 30 μm or less.

4. The group III nitride composite substrate according to claim 1, wherein a ratio $\alpha_{III-N}/\alpha_S$ of a thermal expansion coefficient $\alpha_{III-N}$ of said group III nitride film to a thermal expansion coefficient $\alpha_S$ of said support substrate is 0.75 or more and 1.25 or less, and a ratio $t_{III-N}/t_S$ of a thickness of said group III nitride film to a thickness $t_S$ of said support substrate is 0.02 or more and 1 or less.

5. The group III nitride composite substrate according to claim 1, wherein impurity metal atoms of the main surface of said group III nitride film are $3\times10^{12}$ atoms/cm$^2$ or less.

6. The group III nitride composite substrate according to claim 1, wherein the main surface of said group III nitride film has a root mean square roughness of 3 nm or less.

7. The group III nitride composite substrate according to claim 1, wherein a main surface of said support substrate has a root mean square roughness of 12 nm or less.

8. The group III nitride composite substrate according to claim 1, wherein said group III nitride composite substrate has a diameter of 100 mm or more.

9. The group III nitride composite substrate according to claim 1, wherein said group III nitride composite substrate has a diameter of 125 mm or more and 300 mm or less.

10. The group III nitride composite substrate according to claim 1, wherein
the main surface of said group III nitride film has a mean value $m_{III-N}$ of a root mean square roughness of 0.1 nm or more and 2 nm or less, and a standard deviation $s_{III-N}$ of the root mean square roughness of 0.4 nm or less, and
a main surface of said support substrate has a mean value $m_S$ of a root mean square roughness of 0.3 nm or more and 10 nm or less, and a standard deviation $s_S$ of the root mean square roughness of 3 nm or less.

* * * * *